US006959038B2

(12) United States Patent
Agazzi et al.

(10) Patent No.: US 6,959,038 B2
(45) Date of Patent: *Oct. 25, 2005

(54) HIGH-SPEED DECODER FOR A MULTI-PAIR GIGABIT TRANSCEIVER

(75) Inventors: Oscar E. Agazzi, Irvine, CA (US); David Kruse, Newport Beach, CA (US); Arthur Abnous, Irvine, CA (US); Mehdi Hatamian, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/794,309

(22) Filed: Feb. 27, 2001

(65) Prior Publication Data

US 2002/0006173 A1 Jan. 17, 2002

Related U.S. Application Data

(63) Continuation of application No. 09/370,491, filed on Aug. 9, 1999, now Pat. No. 6,252,904.
(60) Provisional application No. 60/130,616, filed on Apr. 22, 1999, provisional application No. 60/116,946, filed on Jan. 20, 1999, and provisional application No. 60/108,319, filed on Nov. 13, 1998.

(51) Int. Cl.[7] .............................................. H03H 7/30
(52) U.S. Cl. ..................................................... 375/233
(58) Field of Search ............................... 375/229, 232, 375/233

(56) References Cited

U.S. PATENT DOCUMENTS

| 4,631,735 A | | 12/1986 | Qureshi ........................ 375/34 |
| 4,833,693 A | * | 5/1989 | Eyuboglu ..................... 375/254 |
| 5,031,194 A | * | 7/1991 | Crespo et al. ............... 375/233 |
| 5,757,855 A | * | 5/1998 | Strolle et al. ................ 375/262 |
| 5,870,433 A | | 2/1999 | Huber et al. ................. 375/233 |
| 5,872,817 A | * | 2/1999 | Wei .............................. 375/341 |
| 6,009,120 A | | 12/1999 | Nobakht ....................... 375/229 |
| 6,178,198 B1 | * | 1/2001 | Samueli et al. .............. 375/214 |
| 6,252,904 B1 | * | 6/2001 | Agazzi et al. ............... 375/233 |
| 2003/0002575 A1 | * | 1/2003 | Agazzi et al. ............... 375/233 |

FOREIGN PATENT DOCUMENTS

| EP | 0 206 770 A2 | 12/1986 |
| EP | 0 889 612 A2 | 1/1999 |

OTHER PUBLICATIONS

J.W.M. Bergmans et al., "On the Use of Decision Feedback for Simplifying the Viterbi Detector," Philips Journal of Research, Nov. 1987, pp. 399–428, vol. 42, No. 4, XP000565157, Amsterdam, The Netherlands.

(Continued)

*Primary Examiner*—Kevin Burd
(74) *Attorney, Agent, or Firm*—McAndrews, Held & Malloy, Ltd.

(57) ABSTRACT

A method and a system for providing an input signal from a multiple decision feedback equalizer to a decoder based on a tail value and a subset of coefficient values received from a decision-feedback equalizer. A set of pre-computed values based on the subset of coefficient values is generated. Each of the pre-computed values is combined with the tail value to generate a tentative sample. One of the tentative samples is selected as the input signal to the decoder. In one aspect of the system, tentative samples are saturated and then stored in a set of registers before being outputted to a multiplexer which selects one of the tentative samples as the input signal to the decoder. This operation of storing the tentative samples in the registers before providing the tentative samples to the multiplexer facilitates high-speed operation by breaking up a critical path of computations into substantially balanced first and second portions, the first portion including computations in the decision-feedback equalizer and the multiple decision feedback equalizer, the second portion including computations in the decoder.

7 Claims, 15 Drawing Sheets

OTHER PUBLICATIONS

Erich F. Haratsch,"High–Speed VLSI Implementation of Reduced Complexity Sequence Estimation Algorithms with Application to Gigabit Ethernet 1000Base–T," International Symposium on VLSI Technology, Systems and Applications, Jun. 8–10, 1999, pp. 171–174, XP002136642, Piscataway, USA.

Riccardo Raheli, "Per–Survivor Processing: A General Approach to MLSE in Uncertain Environments," IEEE Transactions on Communications, Feb. 1995, pp. 354–364, vol. 43, No. 2–4, XP002059868, New York, USA.

IEEE, "Supplement to Carrier Sense Multiple Access With Collision Detection (CSMA/CD) Access Method and Physical Layer Specifications—Physical Layer Parameters and Specifications for 1000 Mb/s Operation Over 4–Pair of Category 5 Balanced Copper Cabling, Type 1000BASE–T" IEEE Std. 802.3ab (Supplement to IEEE Std 802.3, 1998 Edition), 1999, IEEE.

* cited by examiner

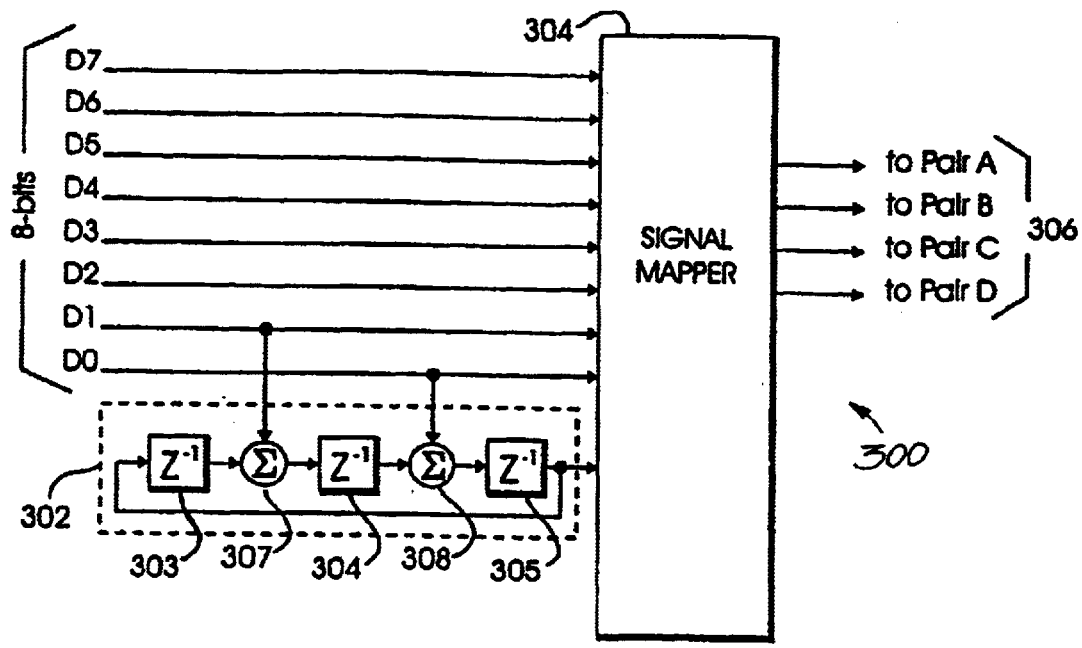
*FIG. 3*
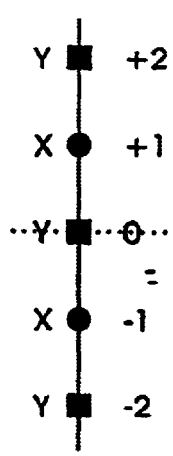
*FIG. 4A*
| | Pair<br>ABCD | | Pair<br>ABCD |
|---|---|---|---|
| s0 | XXXX | U | YYYY |
| s1 | XXXY | U | YYYX |
| s2 | XXYY | U | YYXX |
| s3 | XXYX | U | YYXY |
| s4 | XYYX | U | YXXY |
| s5 | XYYY | U | YXXX |
| s6 | XYXY | U | YXYX |
| s7 | XYXX | U | YXYY |
*FIG. 4B*

| | | | |
|---|---|---|---|
| Viterbï input | S☐☐.☐☐☐ | S5.3 | |
| 1D Error | S☐☐.☐☐ | S4.2 | |
| 1D Error² | ☐.☐☐ | U3.2 | |
| 2D Distance² | ☐.☐☐ | U3.2 | |
| 4D Distance² | ☐☐.☐☐ | U4.2 | Before Min Select |
| 4D Distance² | ☐☐.☐☐ | U4.2 | After Min Select |

*FIG. 16*

| Error Values | 1D Distance² Values |
|---|---|
| 00.00 | 0.00 |
| 00.01 / 11.11 | 0.00 |
| 00.10 / 11.10 | 0.01 |
| 00.11 / 11.01 | 0.10 |
| 01.00 / 11.00 | 1.00 |

| VITERBIINPUT | DECISION X | ERROR X | ROUNDEDERROR X | ERROR X2 | DECISION Y | ERROR Y | ROUNDEDERROR Y | ERROR Y2 |
|---|---|---|---|---|---|---|---|---|
| 01.111 | 001 | 00.111 | 01.00 | 1.00 | 010 | 11.111 | 00.00 | 0.00 |
| 01.110 | 001 | 00.110 | 00.11 | 0.10 | 010 | 11.110 | 11.11 | 0.00 |
| 01.101 | 001 | 00.101 | 00.11 | 0.10 | 010 | 11.101 | 11.11 | 0.00 |
| 01.100 | 001 | 00.100 | 00.10 | 0.01 | 010 | 11.100 | 11.10 | 0.01 |
| 01.011 | 001 | 00.011 | 00.10 | 0.01 | 010 | 11.011 | 11.10 | 0.01 |
| 01.010 | 001 | 00.010 | 00.01 | 0.00 | 010 | 11.010 | 11.01 | 0.10 |
| 01.001 | 001 | 00.001 | 00.01 | 0.00 | 010 | 11.001 | 11.01 | 0.10 |
| 01.000 | 001 | 00.000 | 00.00 | 0.00 | 010 | 11.000 | 11.00 | 1.00 |
| 00.111 | 001 | 11.111 | 11.11 | 0.00 | 000 | 00.111 | 01.00 | 1.00 |
| 00.110 | 001 | 11.110 | 11.11 | 0.00 | 000 | 00.110 | 00.11 | 0.10 |
| 00.101 | 001 | 11.101 | 11.10 | 0.01 | 000 | 00.101 | 00.11 | 0.10 |
| 00.100 | 001 | 11.100 | 11.10 | 0.01 | 000 | 00.100 | 00.10 | 0.01 |
| 00.011 | 001 | 11.011 | 11.01 | 0.10 | 000 | 00.011 | 00.10 | 0.01 |
| 00.010 | 001 | 11.010 | 11.01 | 0.10 | 000 | 00.010 | 00.01 | 0.00 |
| 00.001 | 001 | 11.001 | 11.00 | 1.00 | 000 | 00.001 | 00.01 | 0.00 |
| 00.000 | 001 | 11.000 | 11.00 | 1.00 | 000 | 00.000 | 00.00 | 0.00 |

FIG. 18B

| VITERBIINPUT | DECISION X | ERROR X | ROUNDEDERR OR X | ERROR X2 | DECISION Y | ERROR Y | ROUNDEDERR OR Y | ERROR Y2 |
|---|---|---|---|---|---|---|---|---|
| 11.111 | 111 | 00.111 | 01.00 | 1.00 | 000 | 11.111 | 00.00 | 0.00 |
| 11.110 | 111 | 00.110 | 00.11 | 0.10 | 000 | 11.110 | 11.11 | 0.00 |
| 11.101 | 111 | 00.101 | 00.11 | 0.10 | 000 | 11.101 | 11.11 | 0.00 |
| 11.100 | 111 | 00.100 | 00.10 | 0.01 | 000 | 11.100 | 11.10 | 0.01 |
| 11.011 | 111 | 00.011 | 00.10 | 0.01 | 000 | 11.011 | 11.10 | 0.01 |
| 11.010 | 111 | 00.010 | 00.01 | 0.00 | 000 | 11.010 | 11.01 | 0.10 |
| 11.001 | 111 | 00.001 | 00.00 | 0.00 | 000 | 11.001 | 11.01 | 0.10 |
| 11.000 | 111 | 00.000 | 00.00 | 0.00 | 000 | 11.000 | 11.00 | 1.00 |
| 10.111 | 111 | 11.111 | 11.11 | 0.00 | 110 | 00.111 | 01.00 | 1.00 |
| 10.110 | 111 | 11.110 | 11.11 | 0.01 | 110 | 00.110 | 00.11 | 0.10 |
| 10.101 | 111 | 11.101 | 11.10 | 0.01 | 110 | 00.101 | 00.11 | 0.10 |
| 10.100 | 111 | 11.100 | 11.10 | 0.10 | 110 | 00.100 | 00.10 | 0.01 |
| 10.011 | 111 | 11.011 | 11.01 | 0.10 | 110 | 00.011 | 00.10 | 0.01 |
| 10.010 | 111 | 11.010 | 11.01 | 0.10 | 110 | 00.010 | 00.01 | 0.00 |
| 10.001 | 111 | 11.001 | 11.00 | 0.00 | 110 | 00.001 | 00.01 | 0.00 |
| 10.000 | 111 | 11.000 | 11.00 | 1.00 | 110 | 00.000 | 00.00 | 0.00 |

HIGH-SPEED DECODER FOR A MULTI-PAIR GIGABIT TRANSCEIVER

CROSS REFERENCE TO RELATED APPLICATIONS

The present application is a continuation of application Ser. No. 09/370,491, filed Aug. 9, 1999, now U.S. Pat. No. 6,252,904, which claims priority on the basis of the following provisional application: Ser. No. 60/130,616 entitled "Multi-Pair Gigabit Ethernet Transceiver" filed on Apr. 22, 1999, Ser. No. 60/116,946 entitled "Multiple Decision Feedback Equalizer" filed on Jan. 20, 1999, and Ser. No. 60/108,319 entitled "Gigabit Ethernet Transceiver" filed on Nov. 13, 1998.

The present application is related to the following co-pending applications filed on the same day as the present application and assigned to the same assignee, the contents of each of which are herein incorporated by reference: Ser. No. 09/370,370 entitled "System and Method for Trellis Decoding in a Multi-Pair Transceiver System", Ser. No. 09/370,353 entitled "Multi-Pair Transceiver Decoder System with Low Computation Slicer", Ser. No. 09/370,374 entitled "System and Method for High Speed Decoding and ISI Compensation in a Multi-Pair Transceiver System".

FIELD OF THE INVENTION

The present invention relates generally to methods and systems for decoding received encoded signals and, more particularly, for decoding and ISI compensating multi-dimensional signals, encoded in accordance with a multi-state encoding scheme and modulated in accordance with a multi-level modulation alphabet, with a minimum of computational complexity and propagation delays in the logic circuits.

DESCRIPTION OF THE RELATED ART

In recent years, local area network (LAN) applications have become more and more prevalent as a means for providing local interconnect between personal computer systems, work stations and servers. Because of the breadth of its installed base, the 10BASE-T implementation of Ethernet remains the most pervasive if not the dominant, network technology for LANs. However, as the need to exchange information becomes more and more imperative, and as the scope and size of the information being exchanged increases, higher and higher speeds (greater bandwidth) are required from network interconnect technologies. Among the highspeed LAN technologies currently available, fast Ethernet, commonly termed 100BASE-T, has emerged as the clear technological choice. Fast Ethernet technology provides a smooth, non-disruptive evolution from the 10 megabit per second (Mbps) performance of 10BASE-T applications to the 100 Mbps performance of 100BASE-T. The growing use of 100BASE-T interconnections between servers and desktops is creating a definite need for an even higher speed network technology at the backbone and server level.

One of the more suitable solutions to this need has been proposed in the IEEE 802.3ab standard for gigabit ethernet, also termed 1000BASE-T. Gigabit ethernet is defined as able to provide 1 gigabit per second (Gbps) bandwidth in combination with the simplicity of an ethernet architecture, at a lower cost than other technologies of comparable speed. Moreover, gigabit ethernet offers a smooth, seamless upgrade path for present 10BASE-T or 100BASE-T ethernet installations.

In order to obtain the requisite gigabit performance levels, gigabit ethernet transceivers are interconnected with a multi-pair transmission channel architecture. In particular, transceivers are interconnected using four separate pairs of twisted Category-5 copper wires. Gigabit communication, in practice, involves the simultaneous, parallel transmission of information signals, with each signal conveying information at a rate of 250 megabits per second (Mb/s). Simultaneous, parallel transmission of four information signals over four twisted wire pairs poses substantial challenges to bidirectional communication transceivers, even though the data rate on any one wire pair is "only" 250 Mbps.

In particular, the gigabit ethernet standard requires that digital information being processed for transmission be symbolically represented in accordance with a five-level pulse amplitude modulation scheme (PAM-5) and encoded in accordance with an 8-state Trellis coding methodology. Coded information is then communicated over a multi-dimensional parallel transmission channel to a designated receiver, where the original information must be extracted (demodulated) from a multi-level signal. In gigabit Ethernet, it is important to note that it is the concatenation of signal samples received simultaneously on all four twisted pair lines of the channel that defines a symbol. Thus, demodulator/decoder architectures must be implemented with a degree of computational complexity that allows them to accommodate not only the "state width" of Trellis coded signals, but also the "dimensional depth" represented by the transmission channel.

Computational complexity is not the only challenge presented to modern gigabit capable communication devices. A perhaps greater challenge is that the complex computations required to process "deep" and "wide" signal representations must be performed in an almost vanishingly small period of time. For example, in gigabit applications, each of the four-dimensional signal samples, formed by the four signals received simultaneously over the four twisted wire pairs, must be efficiently decoded within a particular allocated symbol time window of about 8 nanoseconds.

Successfully accomplishing the multitude of sequential processing operations required to decode gigabit signal samples within an 8 nanosecond window requires that the switching capabilities of the integrated circuit technology from which the transceiver is constructed be pushed to almost its fundamental limits. If performed in conventional fashion, sequential signal processing operations necessary for signal decoding and demodulation would result in a propagation delay through the logic circuits that would exceed the clock period, rendering the transceiver circuit non-functional. Fundamentally, then, the challenge imposed by timing constraints must be addressed if gigabit Ethernet is to retain its viability and achieve the same reputation for accurate and robust operation enjoyed by its 10BASE-T and 100BASE-T siblings.

In addition to the challenges imposed by decoding and demodulating multilevel signal samples, transceiver systems must also be able to deal with intersymbol interference (ISI) introduced by transmission channel artifacts as well as by modulation and pulse shaping components in the transmission path of a remote transceiver system. During the demodulation and decoding process of Trellis coded information, ISI components are introduced by either means must also be considered and compensated, further expanding the computational complexity and thus, system latency of the transceiver system. Without a transceiver system capable of efficient, high-speed signal decoding as well as simultaneous ISI compensation, gigabit ethernet would likely not remain a viable concept.

SUMMARY OF THE INVENTION

The present invention is a method and a system for providing an input signal from a multiple decision feedback equalizer to a decoder based on a tail value and a subset of coefficient values received from a decision-feedback equalizer. A set of pre-computed values based on the subset of coefficient values is generated. Each of the pre-computed values is combined with the tail value to generate a tentative sample. One of the tentative samples is selected as the input signal to the decoder.

In one aspect of the system, tentative samples are saturated and then stored in a set of registers before being outputted to a multiplexer which selects one of the tentative samples as the input signal to the decoder. This operation of storing the tentative samples in the registers before providing the tentative samples to the multiplexer facilitates high-speed operation by breaking up a critical path of computations into substantially balanced first and second portions, the first portion including computations in the decision-feedback equalizer and the multiple decision feedback equalizer, the second portion including computations in the decoder.

The present invention can be directed to a system and method for decoding and ISI compensating received signal samples, modulated for transmission in accordance with a multi-level alphabet, and encoded in accordance with a multi-state encoding scheme. Modulated and encoded signal samples are received and decoded in an integrated circuit receiver which includes a multi-state signal decoder. The multi-state signal decoder includes a symbol decoder adapted to receive a set of signal samples representing multi-state signals and evaluate the multi-state signals in accordance with the multi-level modulation alphabet and the multi-state encoding scheme. The symbol decoder outputs tentative decisions.

An ISI compensation circuit is configured to provide ISI compensated signal samples to the symbol decoder. The ISI compensation circuit is constructed of a single decision feedback equalizer, with the single decision feedback equalizer providing ISI compensated signal samples to the symbol decoder based on tentative decisions outputted by the symbol decoder.

In one aspect of the invention, a path memory module is coupled to the symbol decoder and receives decisions and error terms from the symbol decoder. The path memory module includes a plurality of sequential registers, with each corresponding to a respective one of consecutive time intervals. The registers store decisions corresponding to the respective ones of the states of the multi-state encoded signals. Decision circuitry selects a best decision from corresponding ones of the registers, with the best decision of a distal register defining a final decision. The best decision of an intermediate register defines a tentative decision which is output to the ISI compensation circuit.

The single decision feedback equalizer is configured as an FIR filter, and is characterized by a multiplicity of coefficients, subdivided into a set of high-order coefficients and a set of low-order coefficients. Tentative decisions from the path memory module are forced to the single decision feedback equalizer at various locations along the filter delay line and are combined with the high-order coefficients in order to define a partial ISI component. The partial ISI component is arithmetically combined with an input signal sample in order to generate a partially ISI compensated intermediate signal called tail signal.

Low-order coefficients from the single decision feedback equalizer are directed to a convolution engine wherein they are combined with values representing the levels of a multi-level modulation alphabet. The convolution engine outputs a multiplicity of signals, representing the convolution results, each of which are arithmetically combined with the tail signal to define a set of ISI compensated tentative signal samples.

In a particular aspect of the invention, the ISI compensated tentative signal samples are saturated and then stored in a set of registers before being outputted to a multiplexer circuit which selects one of the tentative signal samples as the input signal to the symbol decoder. Storing tentative signal samples in the set of registers before providing the tentative signal samples to the multiplexer, facilitates high-speed operation by breaking up a critical path of computations into substantially balanced first and second portions, the first portion including computation in the ISI compensation circuitry, including the single decision feedback equalizer and the multiple decision feedback equalizer, the second portion including computations in the symbol decoder.

In a further aspect of the present invention, symbol decoder circuitry is implemented as a Viterbi decoder, the Viterbi decoder computing path metrics for each of the N states of a Trellis code, and outputting decisions based on the path metrics. A path memory module is coupled to the Viterbi decoder for receiving decisions. The path memory module is implemented with a number of depth levels corresponding to consecutive time intervals. Each of the depth levels includes N registers for storing decisions corresponding to the N states of the trellis code. Each of the depth levels further includes a multiplexer for selecting a best decision from the corresponding N registers, the best decision at the last depth level defining the final decision, the best decisions at other selected depth levels defining tentative decisions.

In a particular aspect of the invention, tentative decisions are generated from the first three depth levels of the path memory module. These tentative decisions are forced to a single decision feedback equalizer to generate a partial ISI component based on the first three tentative decisions and a set of high-order coefficients. The partial ISI component is arithmetically combined with an input signal sample in order to define a partially ISI compensated tentative signal sample.

The first two coefficients of the single decision feedback equalizer are linearly combined with values representing the five levels of a PAM-5 symbol alphabet, thereby generating a set of 25 pre-computed values, each of which are arithmetically combined with the partial ISI compensated signal sample to develop a set of 25 samples, one of which is a fully ISI compensated signal sample and is chosen as the input to the symbol decoder.

BRIEF DESCRIPTION OF THE DRAWINGS

These and other features, aspects and advantages of the present invention will be more fully understood when considered with respect to the following detailed description, appended claims and accompanying drawings, wherein:

FIG. 3 is a simplified, semi-schematic block diagram of an exemplary trellis encoder.

FIG. 4A illustrates an exemplary PAM-5 constellation and the one-dimensional symbol-subset partitioning.

FIG. 4B illustrates the eight 4D code-subsets constructed from the one-dimensional symbol-subset partitioning of the constellation of FIG. 4A.

FIG. 16 shows the word lengths used in one embodiment of this invention.

FIG. 17 shows an exemplary lookup table suitable for use in computing squared one-dimensional error terms.

FIGS. 18A and 18B are an exemplary look-up table which describes the computation of the decisions and squared errors for both the X and Y subsets directly from one component of the 4D Viterbi input of the 1D slicers of FIG. 7.

DETAILED DESCRIPTION OF THE INVENTION

Figure 1:
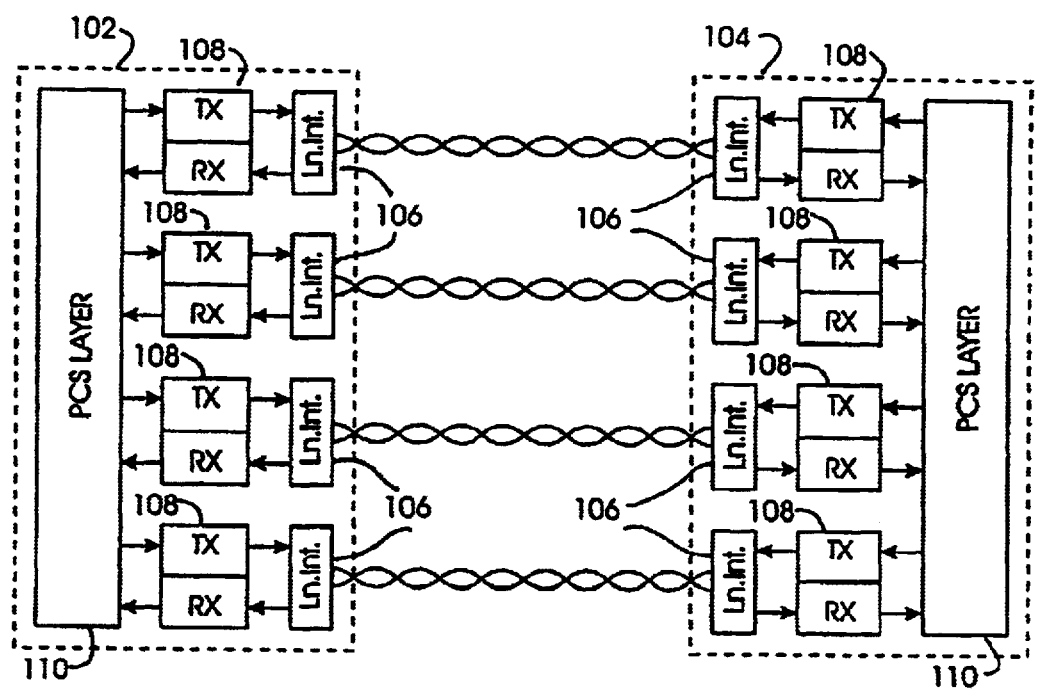
FIG. 1 is a simplified, semi-schematic block diagram of a high-speed bidirectional communication system exemplified by two transceivers configured to communicate over multiple twisted-pair wiring channels.

In the context of an exemplary integrated circuit-type bidirectional communication system, the present invention might be characterized as a system and method for accommodating efficient, high speed decoding of signal samples encoded according to the trellis code specified in the IEEE 802.3ab standard (also termed 1000BASE-T standard).

As will be understood by one having skill in the art, high speed data transmission is often limited by the ability of decoder systems to quickly, accurately and effectively process a transmitted symbol within a given time period. In a 1000BASE-T application (aptly termed gigabit) for example, the symbol decode period is typically taken to be approximately 8 nanoseconds. Pertinent to any discussion of symbol decoding is the realization that 1000BASE-T systems are layered to receive 4-dimensional (4D) signals (each signal corresponding to a respective one of four twisted pair cables) with each of the 4-dimensional signals represented by five analog levels. Accordingly, the decoder circuitry portions of transceiver demodulation blocks require a multiplicity of operational steps to be taken in order to effectively decode each symbol. Such a multiplicity of operations is computationally complex and often pushes the switching speeds of integrated circuit transistors which make up the computational blocks to their fundamental limits.

In accordance with the present invention, a transceiver decoder is able to substantially reduce the computational complexity of symbol decoding, and thus avoid substantial amounts of propagation delay (i.e., increase operational speed), by making use of truncated (or partial) representations of various quantities that make up the decoding/ISI compensation process.

Sample slicing is performed in a manner such that one-dimensional (1D) square error terms are developed in a representation having, at most, three bits if the terms signify a Euclidian distance, and one bit if the terms signify a Hamming distance. Truncated 1D error term representation significantly reduces subsequent error processing complexity because of the fewer number of bits.

Likewise, ISI compensation of sample signals, prior to Viterbi decoding, is performed in a DFE, operatively responsive to tentative decisions made by the Viterbi. Use of tentative decisions, instead of a Viterbi's final decision, reduces system latency by a factor directly related to the path memory sequence distance between the tentative decision used, and the final decision, i.e., if there are N steps in the path memory from input to final decision output, and latency is a function of N, forcing the DFE with a tentative decision at step N-6 causes latency to become a function of N-6. A trade-off between latency reduction and accuracy may be made by choosing a tentative decision step either closer to the final decision point or closer to the initial point.

Computations associated with removing impairments due to intersymbol interference (ISI) are substantially simplified, in accordance with the present invention, by a combination of techniques that involves the recognition that intersymbol interference results from two primary causes, a partial response pulse shaping filter in a transmitter and from the characteristics of a unshielded twisted pair transmission channel. During the initial start-up, ISI impairments are processed in independent portions of electronic circuitry, with ISI caused by a partial response pulse shaping filter being compensated in an inverse partial response filter in a feedforward equalizer (FFE) at system startup, and ISI caused by transmission channel characteristics compensated by a decision feedback equalizer (DFE) operating in conjunction with a multiple decision feedback equalizer (MDFE) stage to provide ISI pre-compensated signals (representing a symbol) to a decoder stage for symbolic decode. Performing the computations necessary for ISI cancellation in a bifurcated manner allows for fast DFE convergence as well as assists a transceiver in achieving fast acquisition in a robust and reliable manner. After the start-up, all ISI is compensated by the combination of the DFE and MDFE.

In order to appreciate the advantages of the present invention, it will be beneficial to describe the invention in the context of an exemplary bidirectional communication device, such as a gigabit ethernet transceiver. The particular exemplary implementation chosen is depicted in FIG. 1, which is a simplified block diagram of a multi-pair communication system operating in conformance with the IEEE 802.3ab standard for one gigabit (Gb/s) Ethernet full-duplex communication over four twisted pairs of Category-5 copper wires.

The communication system illustrated in FIG. 1 is represented as a point-to-point system, in order to simplify the explanation, and includes two main transceiver blocks 102 and 104, coupled together with four twisted-pair cables. Each of the wire pairs is coupled between the transceiver blocks through a respective one of four line interface circuits 106 and communicate information developed by respective ones of four transmitter/receiver circuits (constituent transceivers) 108 coupled between respective interface circuits and a physical coding sublayer (PCS) block 110. Four constituent transceivers 108 are capable of operating simultaneously at 250 megabits per second (Mb/s), and are coupled through respective interface circuits to facilitate full-duplex bidirectional operation. Thus, one Gb/s communication throughput of each of the transceiver blocks 102 and 104 is achieved by using four 250 Mb/s (125 Megabaud at 2 bits per symbol) constituent transceivers 108 for each of the transceiver blocks and four twisted pairs of copper cables to connect the two transceivers together.

The exemplary communication system of FIG. 1 has a superficial resemblance to a 100BASE-T4 system, but is configured to operate at 10 times the bit rate. As such, it should be understood that certain system performance characteristics, such as sampling rates and the like, will be consequently higher causing lengthy and complex computations to be performed during increasingly shorter periods of time. At gigabit data rates over potentially noisy channels, a proportionately greater degree of signal processing is required in many instances to ensure an adequate degree of signal fidelity and quality.

Figure 2:
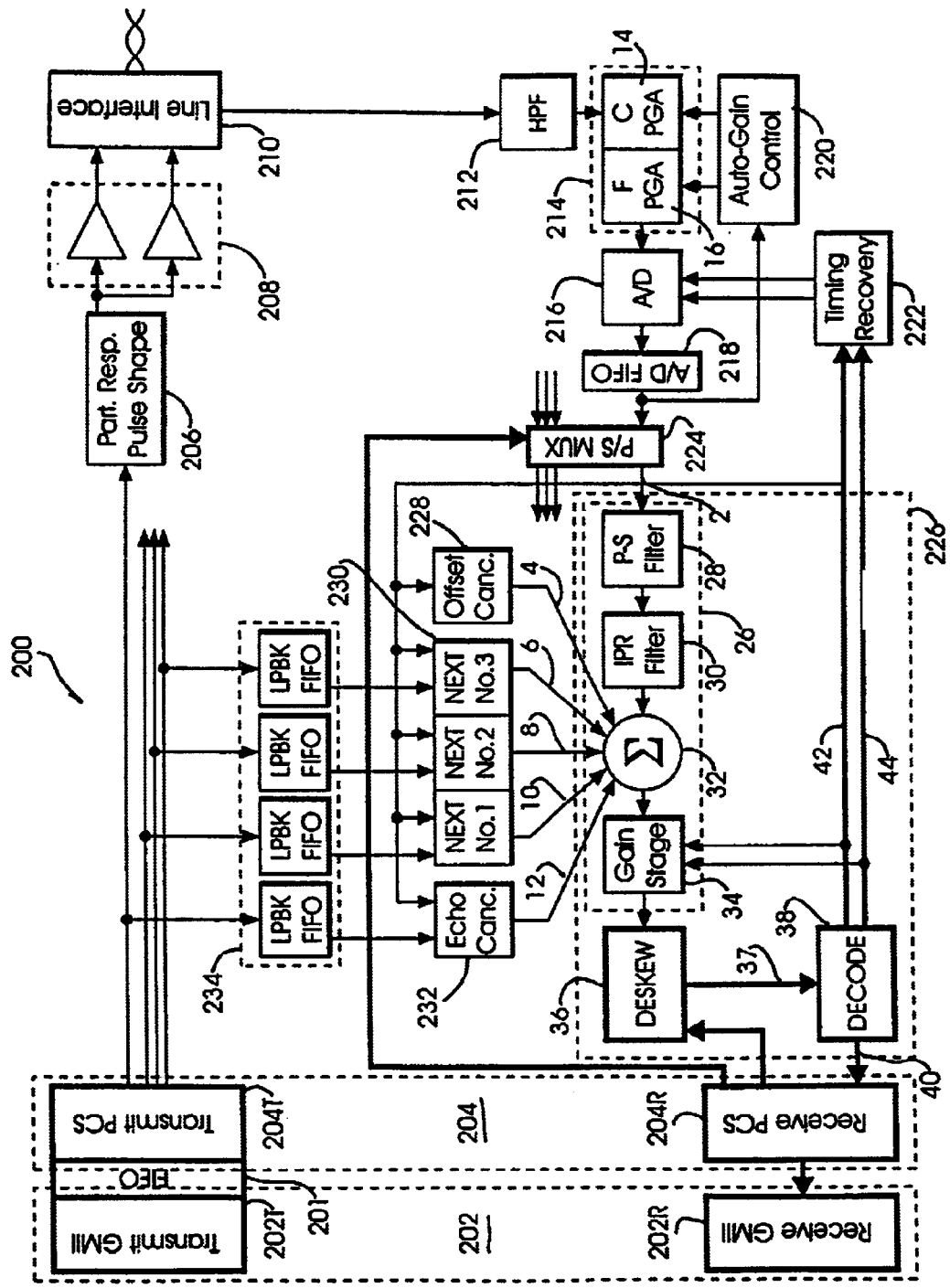
FIG. 2 is a simplified, semi-schematic block diagram of a bidirectional communication transceiver system, constructed in accordance with the present invention.

FIG. 2 is a simplified block diagram of the functional architecture and internal construction of an exemplary transceiver block, indicated generally at 200, such as transceiver 102 of FIG. 1. Since the illustrated transceiver application relates to gigabit ethernet transmission, the transceiver will be referred to as the "gigabit transceiver". For ease of illustration and description, FIG. 2 shows only one of the four 250 Mb/s constituent transceivers which are operating simultaneously (termed herein 4-D operation). However, since the operation of the four constituent transceivers are necessarily interrelated, certain blocks in the signal lines in the exemplary embodiment of FIG. 2 perform and carry 4-dimensional (4-D) functions and 4-D signals, respectively. By 4-D, it is meant that the data from the four constituent transceivers are used simultaneously. In order to clarify signal relationships in FIG. 2, thin lines correspond to 1-dimensional functions or signals (i.e., relating to only a single transceiver), and thick lines correspond to 4-D functions or signals (relating to all four transceivers).

With reference to FIG. 2, the gigabit transceiver 200 includes a Gigabit Medium Independent Interface (GMII) block 202, a Physical Coding Sublayer (PCS) block 204, a pulse shaping filter 206, a digital-to-analog (D/A) converter 208, a line interface block 210, a highpass filter 212, a programmable gain amplifier (PGA) 214, an analog-to-digital (A/D) converter 216, an automatic gain control block 220, a timing recovery block 222, a pair-swap multiplexer block 224, a demodulator 226, an offset canceler 228, a near-end crosstalk (NEXT) canceler block 230 having three NEXT cancelers, and an echo canceler 232. The gigabit transceiver 200 also includes an A/D first-in-first-out buffer (FIFO) 218 to facilitate proper transfer of data from the analog clock region to the receive clock region, and a FIFO block 234 to facilitate proper transfer of data from the transmit clock region to the receive clock region. The gigabit transceiver 200 can optionally include a filter to cancel far-end crosstalk noise (FEXT canceler).

On the transmit path, the transmit section of the GMII block 202 receives data from a Media Access Control (MAC) module (not shown in FIG. 2) and passes the digital data to the transmit section 204T of the PCS block 204 via a FIFO 201 in byte-wide format at the rate of 125 MHz. The FIFO 201 is essentially a synchronization buffer device and is provided to ensure proper data transfer from the MAC layer to the Physical Coding (PHY) layer, since the transmit clock of the PHY layer is not necessarily synchronized with the clock of the MAC layer. This small FIFO 201 can be constructed with from three to five memory cells to accommodate the elasticity requirement which is a function of frame size and frequency offset.

The transmit section 204T of the PCS block 204 performs scrambling and coding of the data and other control functions. Transmit section 204T of the PCS block 204 generates four 1D symbols, one for each of the four constituent transceivers. The 1D symbol generated for the constituent transceiver depicted in FIG. 2 is filtered by a partial response pulse shaping filter 206 so that the radiated emission of the output of the transceiver may fall within the EMI requirements of the Federal Communications Commission. The pulse shaping filter 206 is constructed with a transfer function $0.75+0.25z^{-1}$, such that the power spectrum of the output of the transceiver falls below the power spectrum of a 100Base-Tx signal. The 100Base-Tx is a widely used and accepted Fast Ethernet standard for 100 Mb/s operation on two pairs of category-5 twisted pair cables. The output of the pulse shaping filter 206 is converted to an analog signal by the D/A converter 208 operating at 125 MHz. The analog signal passes through the line interface block 210, and is placed on the corresponding twisted pair cable for communication to a remote receiver.

On the receive path, the line interface block 210 receives an analog signal from the twisted pair cable. The received analog signal is preconditioned by a highpass filter 212 and a programmable gain amplifier (PGA) 214 before being converted to a digital signal by the A/D converter 216 operating at a sampling rate of 125 MHz. Sample timing of the A/D converter 216 is controlled by the output of a timing recovery block 222 controlled, in turn, by decision and error signals from a demodulator 226. The resulting digital signal is properly transferred from the analog clock region to the receive clock region by an A/D FIFO 218, an output of which is also used by an automatic gain control circuit 220 to control the operation of the PGA 214.

The output of the A/D FIFO 218, along with the outputs from the A/D FIFOs of the other three constituent transceivers are inputted to a pair-swap multiplexer block 224. The pair-swap multiplexer block 224 is operatively responsive to a 4D pair-swap control signal, asserted by the receive section 204R of PCS block 204, to sort out the 4 input signals and send the correct signals to the respective demodulators of the 4 constituent transceivers. Since the coding scheme used for the gigabit transceivers 102, 104 (referring to FIG. 1) is based on the fact that each twisted pair of wire corresponds to a 1D constellation, and that the four twisted pairs, collectively, form a 4D constellation, for symbol decoding to function properly, each of the four twisted pairs must be uniquely identified with one of the four dimensions. Any undetected swapping of the four pairs would necessarily result in erroneous decoding. Although described as performed by the receive section 204R of PCS block 204 and the pair-swap multiplexer block 224, in the exemplary embodiment of FIG. 2, the pair-swapping control might alternatively be performed by the demodulator 226.

Demodulator 226 receives the particular received signal 2 intended for it from the pair-swap multiplexer block 224, and functions to demodulate and decode the signal prior to directing the decoded symbols to the PCS layer 204 for transfer to the MAC. The demodulator 226 includes a multi-component feedforward equalizer (FFE) 26, having its output coupled to a de-skew memory circuit 36 and a trellis decoder 38. The FFE 26 is multi-component in the sense that it includes a pulse shaping filter 28, a programmable inverse partial response (IPR) filter 30, a summing device 32, and an adaptive gain stage 34. Functionally, the FFE 26 might be characterized as a least-mean-squares (LMS) type adaptive filter which performs channel equalization as described in the following.

Pulse shaping filter 28 is coupled to receive an input signal 2 from the pair swap MUX 224 and functions to generate a precursor to the input signal 2. Used for timing recovery, the precursor might be aptly described as a zero-crossing inserted at a precursor position of the signal. Such a zero-crossing assists a timing recovery circuit in determining phase relationships between signals, by giving the timing recovery circuit an accurately determinable signal transition point for use as a reference. The pulse shaping filter 28 can be placed anywhere before the decoder block 38. In the exemplary embodiment of FIG. 2, the pulse shaping filter 28 is positioned at the input of the FFE 26.

The pulse shaping filter 28 transfer function may be represented by a function of the form $-\gamma+z^{-1}$, with $\gamma$ equal to $\frac{1}{16}$ for short cables (less than 80 meters) and $\frac{1}{8}$ for long cables (more than 80 m). The determination of the length of a cable is based on the gain of the coarse PGA section 14 of the PGA 214.

A programmable inverse partial response (IPR) filter 30 is coupled to receive the output of the pulse shaping filter 28, and functions to compensate the ISI introduced by the partial response pulse shaping in the transmitter section of the remote transceiver which transmitted the analog equivalent of the digital signal 2. The IPR filter 30 transfer function may be represented by a function of the form $1/(1+Kz^{-1})$ and may also be described as dynamic. In particular, the filter's K value is dynamically varied from an initial non-zero setting, valid at system start-up, to a final setting. K may take any positive value strictly less than 1. In the illustrated embodiment, K might take on a value of about 0.484375 during startup, and be dynamically ramped down to zero after convergence of the decision feedback equalizer included inside the trellis decoder 38.

The foregoing is particularly advantageous in high-speed data recovery systems, since by compensating the transmitter induced ISI at start-up, prior to decoding, it reduces the amount of processing required by the decoder to that required only for compensating transmission channel induced ISI. This "bifurcated" or divided ISI compensation process allows for fast acquisition in a robust and reliable manner. After DFE convergence, noise enhancement in the feedforward equalizer 26 is avoided by dynamically ramping the feedback gain factor K of the IPR filter 30 to zero, effectively removing the filter from the active computational path.

A summing device 32 subtracts from the output of the IPR filter 30 the signals received from the offset canceler 228, the NEXT cancelers 230, and the echo canceler 232. The offset canceler 228 is an adaptive filter which generates an estimate of the offset introduced at the analog front end which includes the PGA 214 and the A/D converter 216. Likewise, the three NEXT cancelers 230 are adaptive filters used for modeling the NEXT impairments in the received signal caused by the symbols sent by the three local transmitters of the other three constituent transceivers. The impairments are due to a near-end crosstalk mechanism between the pairs of cables. Since each receiver has access to the data transmitted by the other three local transmitters, it is possible to nearly replicate the NEXT impairments through filtering. Referring to FIG. 2, the three NEXT cancelers 230 filter the signals sent by the PCS block 204 to the other three local transmitters and produce three signals replicating the respective NEXT impairments. By subtracting these three signals from the output of the IPR filter 30, the NEXT impairments are approximately canceled.

Due to the bi-directional nature of the channel, each local transmitter causes an echo impairment on the received signal of the local receiver with which it is paired to form a constituent transceiver. The echo canceler 232 is an adaptive filter used for modeling the echo impairment. The echo canceler 232 filters the signal sent by the PCS block 204 to the local transmitter associated with the receiver, and produces a replica of the echo impairment. By subtracting this replica signal from the output of the IPR filter 30, the echo impairment is approximately canceled.

Following NEXT, echo and offset cancellation, the signal is coupled to an adaptive gain stage 34 which functions to fine tune the gain of the signal path using a zero-forcing LMS algorithm. Since this adaptive gain stage 34 trains on the basis of errors of the adaptive offset, NEXT and echo cancellation filters 228, 230 and 232 respectively, it provides a more accurate signal gain than the PGA 214.

The output of the adaptive gain stage 34, which is also the output of the FFE 26, is inputted to a de-skew memory 36. The de-skew memory 36 is a four-dimensional function block, i.e., it also receives the outputs of the three FFEs of the other three constituent transceivers as well as the output of FFE 26 illustrated in FIG. 2. There may be a relative skew in the outputs of the 4 FFEs, which are the 4 signal samples representing the 4 symbols to be decoded. This relative skew can be up to 50 nanoseconds, and is due to the variations in the way the copper wire pairs are twisted. In order to correctly decode the four symbols, the four signal samples must be properly aligned. The de-skew memory is responsive to a 4D de-skew control signal asserted by the PCS block 204 to de-skew and align the four signal samples received from the four FFEs. The four de-skewed signal samples are then directed to the trellis decoder 38 for decoding.

Data received at the local transceiver was encoded, prior to transmission by a remote transceiver, using an 8-state four-dimensional trellis code. In the absence of inter-symbol interference (ISI), a proper 8-state Viterbi decoder would provide optimal decoding of this code. However, in the case of Gigabit Ethernet, the Category-5 twisted pair cable introduces a significant amount of ISI. In addition, as was described above in connection with the FFE stage 26, the partial response filter of the remote transmitter on the other end of the communication channel also contributes a certain component of ISI. Therefore, during nominal operation, the trellis decoder 38 must decode both the trellis code and compensate for at least transmission channel induced ISI, at a substantially high computational rate, corresponding to a symbol rate of about 125 Mhz.

In the illustrated embodiment of the gigabit transceiver of FIG. 2, the trellis decoder 38 suitably includes an 8-state Viterbi decoder for symbol decoding, and incorporates circuitry which implements a decision-feedback sequence estimation approach in order to compensate the ISI components perturbing the signal which represents transmitted symbols. The 4D output 40 of the trellis decoder 38 is provided to the receive section 204R of the PCS block. The receive section 204R of PCS block de-scrambles and further decodes the symbol stream and then passes the decoded packets and idle stream to the receive section of the GMII block 202 for transfer to the MAC module.

The 4D outputs 42 and 44, which represent the error and tentative decision signals defined by the decoder, respectively, are provided to the timing recovery block 222, whose output controls the sampling time of the A/D converter 216. One of the four components of the error 42 and one of the four components of the tentative decision 44 correspond to the signal stream pertinent to the particular receiver section, illustrated in FIG. 2, and are provided to the adaptive gain stage 34 to adjust the gain of the signal path.

The component 42A of the 4D error 42, which corresponds to the receiver shown in FIG. 2, is further provided to the adaptation circuitry of each of the adaptive offset, NEXT and echo cancellation filters 228, 230, 232. Adaptation circuitry evaluates the content of the error component and, initially, adapts the filter's training process to develop suitable filter coefficient values. During nominal operation, adaptation circuitry monitors the error component and provides periodic updates to the filter coefficients in response thereto.

As implemented in the exemplary Ethernet gigabit transceiver, the trellis decoder 38 functions to decode symbols that have been encoded in accordance with the trellis code specified in the IEEE 802.3ab standard (1000BASE-T, or gigabit). As mentioned above, information signals are communicated between transceivers at a symbol rate of about 125 Mhz, on each of the pairs of twisted copper cables that make up the transmission channel. In accordance with established Ethernet communication protocols, information signals are modulated for transmission in accordance with a 5-level Pulse Amplitude Modulation (PAM-5) modulation scheme. Thus, since information signals are represented by five amplitude levels, it will be understood that symbols can be expressed in a three bit representation on each twisted wire pair.

Turning now to FIGS. 4A and 4B, an exemplary PAM-5 constellation is depicted in FIG. 4A which also depicts the one-dimensional symbol subset partitioning within the constellation. As illustrated in FIG. 4A, the constellation is a representation of five amplitude levels, +2, +1, 0, −1, −2, in decreasing order. Symbol subset partitioning occurs by dividing the five levels into two 1D subsets, X and Y, and assigning X and Y subset designations to the five levels on an alternating basis. Thus +2, 0 and −2 are assigned to the Y subset; +1 and −1 are assigned to the X subset. The partitioning could, of course, be reversed, with +1 and −1 being assigned a Y designation.

It should be recognized that although the X and Y subsets represent different absolute amplitude levels, the vector distance between neighboring amplitudes within the subsets are the same, i.e., two (2). The X subset therefore includes amplitude level designations which differ by a value of two, (−1, +1), as does the Y subset (−2, 0, +2). This partitioning offers certain advantages to slicer circuitry in a decoder, as will be developed further below.

In FIG. 4B, the 1D subsets have been combined into 4D subsets representing the four twisted pairs of the transmission channel. Since 1D subset definition is binary (X:Y) and there are four wire pairs, there are sixteen possible combinations of 4D subsets. These sixteen possible combinations are assigned into eight 4D subsets, s0 to s7 inclusive, in accordance with a trellis coding scheme. Each of the 4D subsets (also termed code subsets) are constructed of a union of two complementary 4D sub-subsets, e.g., code-subset three (identified as s3) is the union of sub-subset X:X:Y:X and its complementary image Y:Y:X:Y.

Data being processed for transmission is encoded using the above described 4-dimensional (4D) 8-state trellis code, in an encoder circuit, such as illustrated in the exemplary block diagram of FIG. 3, according to an encoding algorithm specified in the 1000BASE-T standard. Referring to FIG. 3, an exemplary encoder 300, which is commonly provided in the transmit PCS portion of a gigabit transceiver, might be represented in simplified form as a convolutional encoder 302 in combination with a signal mapper 304. Data received by the transmit PCS from the MAC module via the transmit gigabit medium independent interface are encoded with control data and scrambled, resulting in an eight bit data word represented by input bits $D_0$ through $D_7$ which are introduced to the signal mapper 304 of the encoder 300 at a data rate of about 125 MHz. The two least significant bits, $D_0$ and $D_1$, are also inputted, in parallel fashion, into a convolutional encoder 302, implemented as a linear feedback shift register, in order to generate a redundancy bit C which is a necessary condition for the provision of the coding gain of the code.

As described above, the convolutional encoder 302 is a linear feedback shift register, constructed of three delay elements 303, 304 and 305 (conventionally denoted by $z^{-1}$) interspersed with and separated by two summing circuits 307 and 308 which function to combine the two least significant bits (LSBs), $D_0$ and $D_1$, of the input word with the output of the first and second delay elements, 303 and 304 respectively. The two time sequences formed by the streams of the two LSBs are convolved with the coefficients of the linear feedback shift register to produce the time sequence of the redundancy bit C. Thus, the convolutional encoder might be viewed as a state machine.

The signal mapper 304 maps the 9 bits ($D_0$–$D_7$ and C) into a particular 4-dimensional constellation point. Each of the four dimensions uniquely corresponds to one of the four twisted wire pairs. In each dimension, the possible symbols are from the symbol set $\{-2, -1, 0, +1, +2\}$. The symbol set is partitioned into two disjoint symbol subsets X and Y, with X=$\{-1, +1\}$ and Y=$\{-2, 0, +2\}$, as described above and shown in FIG. 4A.

Referring to FIG. 4B, the eight code subsets s0 through s7 define the constellation of the code in the signal space. Each of the code subsets is formed by the union of two code sub-subsets, each of the code sub-subsets being formed by 4D patterns obtained from concatenation of symbols taken from the symbol subsets X and Y. For example, the code subset s0 is formed by the union of the 4D patterns from the 4D code sub-subsets XXXX and YYYY. It should be noted that the distance between any two arbitrary even (respectively, odd) code-subsets is $\sqrt{2}$. It should be further noted that each of the code subsets is able to define at least 72 constellation points. However, only 64 constellation points in each code subset are recognized as codewords of the trellis code specified in the 1000BASE-T standard.

This reduced constellation is termed the pruned constellation. Hereinafter, the term "codeword" is used to indicate a 4D symbol that belongs to the pruned constellation. A valid codeword is part of a valid path in the trellis diagram.

Referring now to FIG. 3 and with reference to FIGS. 4A and 4B, in operation, the signal mapper 304 uses the 3 bits $D_1$, $D_0$ and C to select one of the code subsets s0–s7, and uses the 6 MSB bits of the input signal, $D_2$–$D_7$ to select one of 64 particular points in the selected code subset. These 64 particular points of the selected coded subset correspond to codewords of the trellis code. The signal mapper 304 outputs the selected 4D constellation point 306 which will be placed on the four twisted wire pairs after pulse shape filtering and digital-to-analog conversion.

Figure 5:
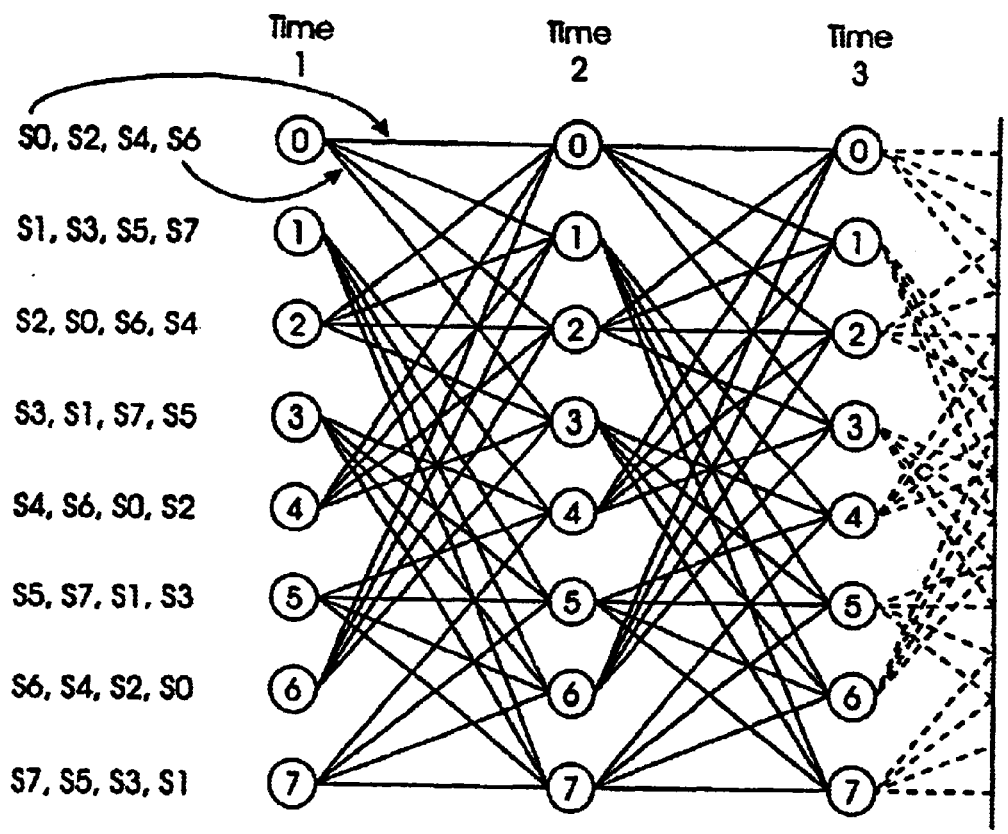
FIG. 5 illustrates the trellis diagram for the code.

FIG. 5 shows the trellis diagram for the trellis code specified in the 1000BASE-T standard. In the trellis diagram, each vertical column of nodes represents the possible states that the encoder 300 (FIG. 3) can assume at a point in time. It is noted that the states of the encoder 300 are dictated by the states of the convolutional encoder 302 (FIG. 3). Since the convolutional encoder 302 has three delay elements, there are eight distinct states. Successive columns of nodes represent the possible states that might be defined by the convolutional encoder state machine at successive points in time.

Referring to FIG. 5, the eight distinct states of the encoder 300 are identified by numerals 0 through 7, inclusive. From any given current state, each subsequent transmitted 4D symbol must correspond to a transition of the encoder 300 from the given state to a permissible successor state. For example, from the current state 0 (respectively, from current states 2, 4, 6), a transmitted 4D symbol taken from the code subset s0 corresponds to a transition to the successor state 0 (respectively, to successor states 1, 2 or 3). Similarly, from current state 0, a transmitted 4D symbol taken from code subset s2 (respectively, code subsets s4, s6) corresponds to a transition to successor state 1 (respectively, successor states 2, 3).

Familiarity with the trellis diagram of FIG. 5, illustrates that from any even state (i.e., states 0, 2, 4 or 6), valid transitions can only be made to certain ones of the successor states, i.e., states 0, 1, 2 or 3. From any odd state (states 1, 3, 5 or 7), valid transitions can only be made to the remaining successor states, i.e., states 4, 5, 6 or 7. Each transition in the trellis diagram, also called a branch, may be thought of as being characterized by the predecessor state (the state it leaves), the successor state (the state it enters) and the corresponding transmitted 4D symbol. A valid sequence of states is represented by a path through the trellis which follows the above noted rules. A valid sequence of states corresponds to a valid sequence of transmitted 4D symbols.

At the receiving end of the communication channel, the trellis decoder 38 uses the methodology represented by the trellis diagram of FIG. 5 to decode a sequence of received signal samples into their symbolic representation, in accordance with the well known Viterbi algorithm. A traditional Viterbi decoder processes information signals iteratively, on an information frame by information frame basis (in the Gigabit Ethernet case, each information frame is a 4D received signal sample corresponding to a 4D symbol), tracing through a trellis diagram corresponding to the one used by the encoder, in an attempt to emulate the encoder's behavior. At any particular frame time, the decoder is not instantaneously aware of which node (or state) the encoder has reached, thus, it does not try to decode the node at that particular frame time. Instead, given the received sequence of signal samples, the decoder calculates the most likely path to every node and determines the distance between each of such paths and the received sequence in order to determine a quantity called the path metric.

In the next frame time, the decoder determines the most likely path to each of the new nodes of that frame time. To get to any one of the new nodes, a path must pass through one of the old nodes. Possible paths to each new node are obtained by extending to this new node each of the old paths that are allowed to be thus extended, as specified by the trellis diagram. In the trellis diagram of FIG. 5, there are four possible paths to each new node. For each new node, the extended path with the smallest path metric is selected as the most likely path to this new node.

By continuing the above path-extending process, the decoder determines a set of surviving paths to the set of nodes at the nth frame time. If all of the paths pass through the same node at the first frame time, then the traditional decoder knows which most likely node the encoder entered at the first frame time, regardless of which node the encoder entered at the nth frame time. In other words, the decoder knows how to decode the received information associated with the first frame time, even though it has not yet made a decision for the received information associated with the nth frame time. At the nth frame time, the traditional decoder examines all surviving paths to see if they pass through the same first branch in the first frame time. If they do, then the valid symbol associated with this first branch is outputted by the decoder as the decoded information frame for the first frame time. Then, the decoder drops the first frame and takes in a new frame for the next iteration. Again, if all surviving paths pass through the same node of the oldest surviving frame, then this information frame is decoded. The decoder continues this frame-by-frame decoding process indefinitely so long as information is received.

The number of symbols that the decoder can store is called the decoding-window width. The decoder must have a decoding window width large enough to ensure that a well-defined decision will almost always be made at a frame time. As discussed later in connection with FIGS. 13 and 14, the decoding window width of the trellis decoder 38 of FIG. 2 is 10 symbols. This length of the decoding window is selected based on results of computer simulation of the trellis decoder 38.

A decoding failure occurs when not all of the surviving paths to the set of nodes at frame time n pass through a common first branch at frame time 0. In such a case, the traditional decoder would defer making a decision and would continue tracing deeper in the trellis. This would cause unacceptable latency for a high-speed system such as the gigabit Ethernet transceiver. Unlike the traditional decoder, the trellis decoder 38 of the present invention does not check whether the surviving paths pass through a common first branch. Rather, the trellis decoder, in accordance with the invention, makes an assumption that the surviving paths at frame time n pass through such a branch, and outputs a decision for frame time 0 on the basis of that assumption. If this decision is incorrect, the trellis decoder 38 will necessarily output a few additional incorrect decisions based on the initial perturbation, but will soon recover due to the nature of the particular relationship between the code and the characteristics of the transmission channel. It should, further, be noted that this potential error introduction source is relatively trivial in actual practice, since the assumption made by the trellis decoder 38 that all the surviving paths at frame time n pass through a common first branch at frame time 0 is a correct one to a very high statistical probability.

Figure 6:
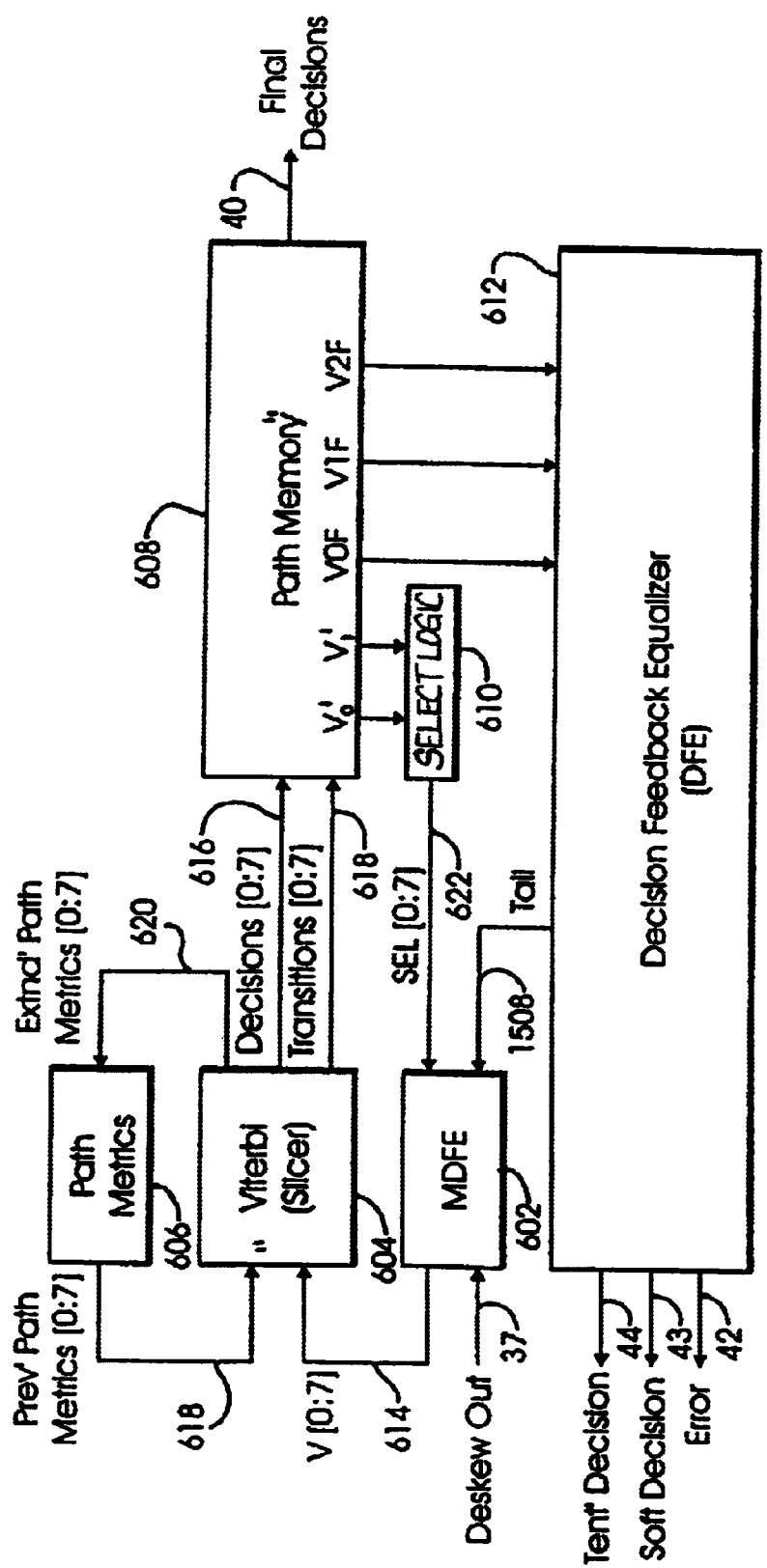
FIG. 6 is a simplified, semi-schematic block diagram of an exemplary trellis decoder, including a Viterbi decoder, in accordance with the invention, suitable for decoding signals coded by the exemplary trellis encoder of FIG. 3.

FIG. 6 is a simplified block diagram of the construction details of an exemplary trellis decoder such as described in connection with FIG. 2. The exemplary trellis decoder (again indicated generally at 38) is constructed to include a multiple decision feedback equalizer (MDFE) 602, Viterbi decoder circuitry 604, a path metrics module 606, a path memory module 608, a select logic 610, and a decision feedback equalizer 612. In general, a Viterbi decoder is often thought of as including the path metrics module and the path memory module. However, because of the unique arrangement and functional operation of the elements of the exemplary trellis decoder 38, the functional element which performs the slicing operation will be referred to herein as Viterbi decoder circuitry, a Viterbi decoder, or colloquially a Viterbi.

The Viterbi decoder circuitry 604 performs 4D slicing of signals received at the Viterbi inputs 614, and computes the branch metrics. A branch metric, as the term is used herein, is well known and refers to an elemental path between neighboring Trellis nodes. A plurality of branch metrics will thus be understood to make up a path metric. An extended path metric will be understood to refer to a path metric, which is extended by a next branch metric to thereby form an extension to the path. Based on the branch metrics and the previous path metrics information 618 received from the path metrics module 606, the Viterbi decoder 604 extends the paths and computes the extended path metrics 620 which are returned to the path metrics module 606. The Viterbi decoder 604 selects the best path incoming to each of the eight states, updates the path memory stored in the path memory module 608 and the path metrics stored in the path metrics module 606.

In the traditional Viterbi decoding algorithm, the inputs to a decoder are the same for all the states of the code. Thus, a traditional Viterbi decoder would have only one 4D input for a 4D 8-state code. In contrast, and in accordance with the present invention, the inputs 614 to the Viterbi decoder 604 are different for each of the eight states. This is the result of the fact the Viterbi inputs 614 are defined by feedback signals generated by the MDFE 602 and are different for each of the eight paths (one path per state) of the Viterbi decoder 604, as will be discussed later.

There are eight Viterbi inputs 614 and eight Viterbi decisions 616, each corresponding to a respective one of the eight states of the code. Each of the eight Viterbi inputs 614, and each of the decision outputs 618, is a 4-dimensional vector whose four components are the Viterbi inputs and decision outputs for the four constituent transceivers, respectively. In other words, the four components of each of the eight Viterbi inputs 614 are associated with the four pairs of the Category-5 cable. The four components are a received word that corresponds to a valid codeword. From the foregoing, it should be understood that detection (decoding, demodulation, and the like) of information signals in a gigabit system is inherently computationally intensive. When it is further realized that received information must be detected at a very high speed and in the presence of ISI channel impairments, the difficulty in achieving robust and reliable signal detection will become apparent.

In accordance with the present invention, the Viterbi decoder 604 detects a non-binary word by first producing a set of one-dimensional (1D) decisions and a corresponding set of 1D errors from the 4D inputs. By combining the 1D decisions with the 1D errors, the decoder produces a set of 4D decisions and a corresponding set of 4D errors. Hereinafter, this generation of 4D decisions and errors from the 4D inputs is referred to as 4D slicing. Each of the 1D errors represents the distance metric between one 1D component of the eight 4D-inputs and a symbol in one of the two disjoint symbol-subsets X, Y. Each of the 4D errors is the distance between the received word and the corresponding 4D decision which is a codeword nearest to the received word with respect to one of the code-subsets s1, where i=0, . . . 7.

4D errors may also be characterized as the branch metrics in the Viterbi algorithm. The branch metrics are added to the previous values of path metrics 618 received from the path metrics module 606 to form the extended path metrics 620 which are then stored in the path metrics module 606, replacing the previous path metrics. For any one given state of the eight states of the code, there are four incoming paths. For a given state, the Viterbi decoder 604 selects the best path, i.e., the path having the lowest metric of the four paths incoming to that state, and discards the other three paths. The best path is saved in the path memory module 608. The metric associated with the best path is stored in the path metrics module 606, replacing the previous value of the path metric stored in that module.

In the following, the 4D slicing function of the Viterbi decoder 604 will be described in detail. 4D slicing may be described as being performed in three sequential steps. In a first step, a set of 1D decisions and corresponding 1D errors are generated from the 4D Viterbi inputs. Next, the 1D decisions and 1D errors are combined to form a set of 2D decisions and corresponding 2D errors. Finally, the 2D decisions and 2D errors are combined to form 4D decisions and corresponding 4D errors.

Figure 7:
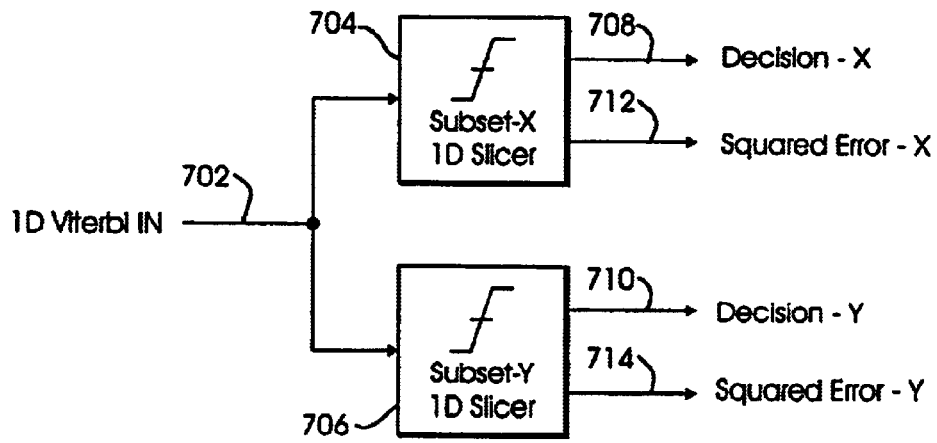
FIG. 7 is a simplified block diagram of a first exemplary embodiment of a structural analog of a 1D slicing function as might be implemented in the Viterbi decoder of FIG. 6.

FIG. 7 is a simplified, conceptual block diagram of a first exemplary embodiment of a 1D slicing function such as might be implemented by the Viterbi decoder 604 of FIG. 6. Referring to FIG. 7, a 1D component 702 of the eight 4D Viterbi inputs (614 of FIG. 6) is sliced, i.e., detected, in parallel fashion, by a pair of 1D slicers 704 and 706 with respect to the X and Y symbol-subsets. Each slicer 704 and 706 outputs a respective 1D decision 708 and 710 with respect to the appropriate respective symbol-subset X, Y and an associated squared error value 712 and 714. Each 1D decision 708 or 710 is the symbol which is closest to the 1D input 702 in the appropriate symbol-subset X and Y, respectively. The squared error values 712 and 714 each represent the square of the difference between the 1D input 702 and their respective 1D decisions 708 and 710.

The 1D slicing function shown in FIG. 7 is performed for all four constituent transceivers and for all eight states of the trellis code in order to produce one pair of 1D decisions per transceiver and per state. Thus, the Viterbi decoder 604 has a total of 32 pairs of 1D slicers disposed in a manner identical to the pair of slicers 704, 706 illustrated in FIG. 7.

Figure 8:
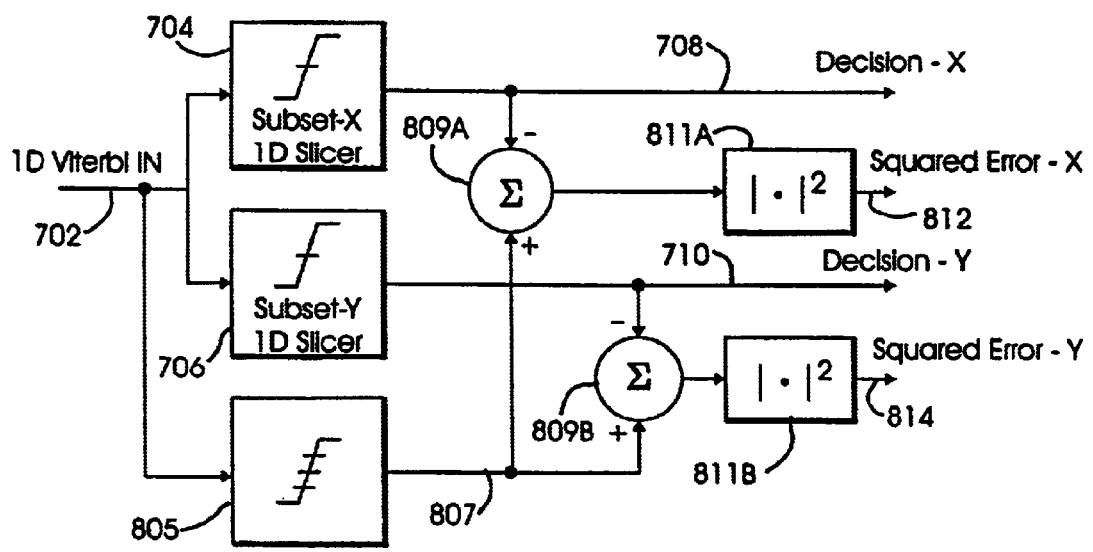
FIG. 8 is a simplified block diagram of a second exemplary embodiment of a structural analog of a 1D slicing function as might be implemented in the Viterbi decoder of FIG. 6.

FIG. 8 is a simplified block diagram of a second exemplary embodiment of circuitry capable of implementing a 1D slicing function suitable for incorporation in the Viterbi decoder 604 of FIG. 5. Referring to FIG. 8, the 1D component 702 of the eight 4D Viterbi inputs is sliced, i.e., detected, by a first pair of 1D slicers 704 and 706, with respect to the X and Y symbol-subsets, and also by a 5-level slicer 805 with respect to the symbol set which represents the five levels (+2, +1, 0, −1, −2) of the constellation, i.e., a union of the X and Y symbol-subsets. As in the previous case described in connection with FIG. 7, the slicers 704 and 706 output 1D decisions 708 and 710. The 1D decision 708 is the symbol which is nearest the 1D input 702 in the symbol-subset X, while 1D decision 710 corresponds to the symbol which is nearest the 1D input 702 in the symbol-subset Y.

The output 807 of the 5-level slicer 805 corresponds to the particular one of the five constellation symbols which is determined to be closest to the 1D input 702.

The difference between each decision 708 and 710 and the 5-level slicer output 807 is processed, in a manner to be described in greater detail below, to generate respective quasi-squared error terms 812 and 814. In contrast to the 1D error terms 712, 714 obtained with the first exemplary embodiment of a 1D slicer depicted in FIG. 7, the 1D error terms 812, 814 generated by the exemplary embodiment of FIG. 8 are more easily adapted to discerning relative differences between a 1D decision and a 1D Viterbi input.

In particular, the slicer embodiment of FIG. 7 may be viewed as performing a "soft decode", with 1D error terms 712 and 714 represented by Euclidian metrics. The slicer embodiment depicted in FIG. 8 may be viewed as performing a "hard decode", with its respective 1D error terms 812 and 814 expressed in Hamming metrics (i.e., 1 or 0). Thus, there is less ambiguity as to whether the 1D Viterbi input is closer to the X symbol subset or to the Y symbol subset. Furthermore, Hamming metrics can be expressed in a fewer number of bits, than Euclidian metrics, resulting in a system that is substantially less computationally complex and substantially faster.

In the exemplary embodiment of FIG. 8, error terms are generated by combining the output of the five level slicer 805 with the outputs of the 1D slicers 704 and 706 in respective adder circuits 809A and 809B. The outputs of the adders are directed to respective squared magnitude blocks 811A and 811B which generate the binary squared error terms 812 and 814, respectively.

Implementation of squared error terms by use of circuit elements such as adders 809A, 809B and the magnitude squared blocks 811A, 811B is done for descriptive convenience and conceptual illustration purposes only. In practice, squared error term definition is implemented with a look-up table that contains possible values for error-X and error-Y for a given set of decision-X, decision-Y and Viterbi input values. The look-up table can be implemented with a read-only-memory device or alternatively, a random logic device or PLA. Examples of look-up tables, suitable for use in practice of the present invention, are illustrated in FIGS. 17, 18A and 18B.

The 1D slicing function exemplified in FIG. 8 is performed for all four constituent transceivers and for all eight states of the trellis code in order to produce one pair of 1D decisions per transceiver and per state. Thus, the Viterbi decoder 604 has a total of thirty two pairs of 1D slicers that correspond to the pair of slicers 704, 706, and thirty two 5-level slicers that correspond to the 5-level slicer 805 of FIG. 8.

Each of the 1D errors is represented by substantially fewer bits than each 1D component of the 4D inputs. For example, in the embodiment of FIG. 7, the 1D component of the 4D Viterbi input is represented by 5 bits, while the 1D error is represented by 2 or 3 bits. Traditionally, proper soft decision decoding of such a trellis code would require that the distance metric (Euclidean distance) be represented by 6 to 8 bits. One advantageous feature of the present invention is that only 2 or 3 bits are required for the distance metric in soft decision decoding of this trellis code.

In the embodiment of FIG. 8, the 1D error can be represented by just 1 bit. It is noted that, since the 1D error is represented by 1 bit, the distance metric used in this trellis decoding is no longer the Euclidean distance, which is usually associated with trellis decoding, but is instead the Hamming distance, which is usually associated with hard decision decoding of binary codewords. This is another particularly advantageous feature of the present invention.

Figure 9:
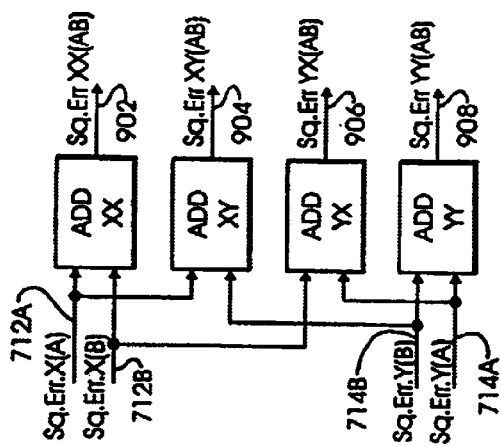
FIG. 9 is a simplified block diagram of a 2D error term generation machine, illustrating the generation of 2D square error terms from the 1D square error terms developed by the exemplary slicers of FIG. 7 or 8.

FIG. 9 is a block diagram illustrating the generation of the 2D errors from the 1D errors for twisted pairs A and B (corresponding to constituent transceivers A and B). Since the generation of errors is similar for twisted pairs C and D, this discussion will only concern itself with the A:B 2D case. It will be understood that the discussion is equally applicable to the C:D 2D case with the appropriate change in notation. Referring to FIG. 9, 1D error signals 712A, 712B, 714A, 714B might be produced by the exemplary 1D slicing functional blocks shown in FIGS. 7 or 8. The 1D error term signal 712A (or respectively, 712B) is obtained by slicing, with respect to symbol-subset X, the 1D component of the 4D Viterbi input, which corresponds to pair A (or respectively, pair B). The 1D error term 714A (respectively, 714B) is obtained by slicing, with respect to symbol-subset Y, the 1D component of the 4D Viterbi input, which corresponds to pair A (respectively, B). The 1D errors 712A, 712B, 714A, 714B are added according to all possible combinations (XX, XY, YX and YY) to produce 2D error terms 902AB, 904AB, 906AB, 908AB for pairs A and B. Similarly, the 1D errors 712C, 712D, 714C, 714D (not shown) are added according to the four different symbol-subset combinations XX, XY, YX and YY) to produce corresponding 2D error terms for wire pairs C and D.

Figure 10:
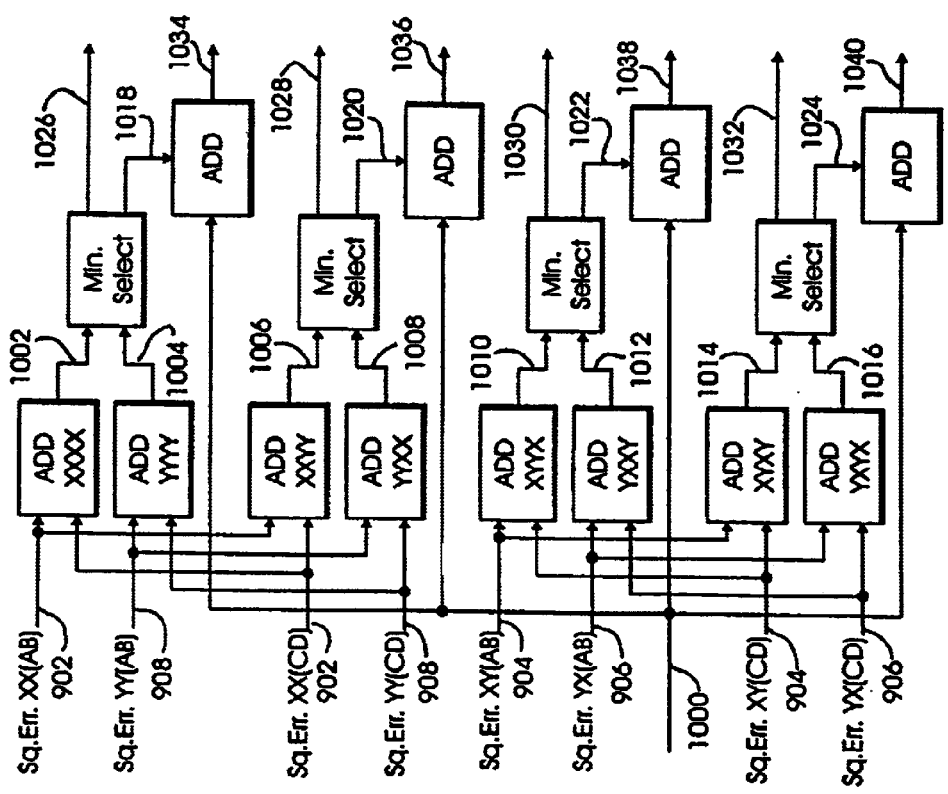
FIG. 10 is a simplified block diagram of a 4D error term generation machine, illustrating the generation of 4D square error terms and the generation of extended path metrics for the 4 extended paths outgoing from state 0.

FIG. 10 is a block diagram illustrating the generation of the 4D errors and extended path metrics for the four extended paths outgoing from state 0. Referring to FIG. 10, the 2D errors 902AB, 902CD, 904AB, 904CD, 906AB, 906CD, 908AB, 908CD are added in pairs according to eight different combinations to produce eight intermediate 4D errors 1002, 1004, 1006, 1008, 1010, 1012, 1014, 1016. For example, the 2D error 902AB, which is the squared error with respect to XX from pairs A and B, are added to the 2D error 902CD, which is the squared error with respect to XX from pairs C and D, to form the intermediate 4D error 1002 which is the squared error with respect to sub-subset XXXX for pairs A, B, C and D. Similarly, the intermediate 4D error 1004 which corresponds to the squared error with respect to sub-subset YYYY is formed from the 2D errors 908AB and 908CD.

The eight intermediate 4D errors are grouped in pairs to correspond to the code subsets s0, s2, s4 and s6 represented in FIG. 4B. For example, the intermediate 4D errors 1002 and 1004 are grouped together to correspond to the code subset s0 which is formed by the union of the XXXX and YYYY sub-subsets. From each pair of intermediate 4D errors, the one with the lowest value is selected (the other one being discarded) in order to provide the branch metric of a transition in the trellis diagram from state 0 to a subsequent state. It is noted that, according to the trellis diagram, transitions from an even state (i.e., 0, 2, 4 and 6) are only allowed to be to the states 0, 1, 2 and 3, and transitions from an odd state (i.e., 1, 3, 5 and 7) are only allowed to be to the states 4, 5, 6 and 7. Each of the index signals 1026, 1028, 1030, 1032 indicates which of the 2 sub-subsets the selected intermediate 4D error corresponds to. The branch metrics 1018, 1020, 1022, 1024 are the branch metrics for the transitions in the trellis diagram of FIG. 5 associated with code-subsets s0, s2, s4 and s6 respectively, from state 0 to states 0, 1, 2 and 3, respectively. The branch metrics are added to the previous path metric 1000 for state 0 in order to produce the extended path metrics 1034, 1036, 1038, 1040 of the four extended paths outgoing from state 0 to states 0, 1, 2 and 3, respectively.

Associated with the eight intermediate 4D errors 1002, 1004, 1006, 1008, 1010, 1012, 1014, 1016 are the 4D decisions which are formed from the 1D decisions made by one of the exemplary slicer embodiments of FIG. 7 or 8. Associated with the branch metrics 1018, 1020, 1022, 1024 are the 4D symbols derived by selecting the 4D decisions using the index outputs 1026, 1028, 1030, 1032.

Figure 11:
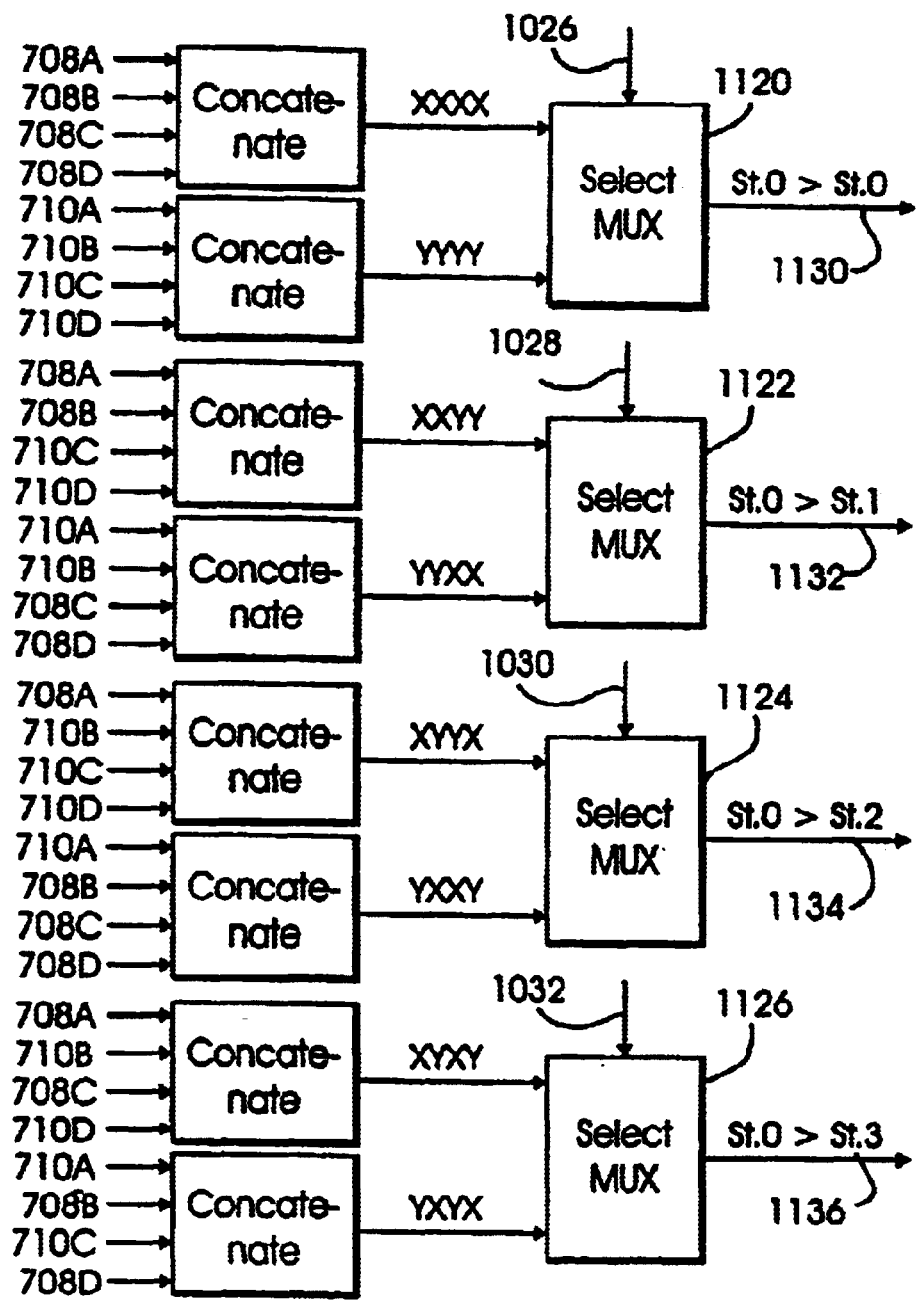
FIG. 11 is a simplified block diagram of a 4D symbol generation machine.

FIG. 11 shows the generation of the 4D symbols associated with the branch metrics 1018, 1020, 1022, 1024. Referring to FIG. 11, the 1D decisions 708A, 708B, 708C, 708D are the 1D decisions with respect to symbol-subset X (as shown in FIG. 7) for constituent transceivers A, B, C, D, respectively, and the 1D decisions 714A, 714B, 714C, 714D are the 1D decisions with respect to symbol-subset Y for constituent transceivers A, B, C and D, respectively. The 1D decisions are concatenated according to the combinations which correspond to a left or right hand portion of the code subsets s0, s2, s4 and s6, as depicted in FIG. 4B. For example, the 1D decisions 708A, 708B, 708C, 708D are concatenated to correspond to the left hand portion, XXXX, of the code subset s0. The 4D decisions are grouped in pairs to correspond to the union of symbol-subset portions making up the code subsets s0, s2, s4 and s6. In particular, the 4D decisions 1102 and 1104 are grouped together to correspond to the code subset s0 which is formed by the union of the XXXX and YYYY subset portions.

Referring to FIG. 11, the pairs of 4D decisions are inputted to the multiplexers 1120, 1122, 1124, 1126 which receive the index signals 1026, 1028, 1030, 1032 (FIG. 10) as select signals. Each of the multiplexers selects from a pair of the 4D decisions, the 4D decision which corresponds to the sub-subset indicated by the corresponding index signal and outputs the selected 4D decision as the 4D symbol for the branch whose branch metric is associated with the index signal. The 4D symbols 1130, 1132, 1134, 1136 correspond to the transitions in the trellis diagram of FIG. 5 associated with code-subsets s0, s2, s4 and s6 respectively, from state 0 to states 0, 1, 2 and 3, respectively. Each of the 4D symbols 1130, 1132, 1134, 1136 is the codeword in the corresponding code-subset (s0, s2, s4 and s6) which is closest to the 4D Viterbi input for state 0 (there is a 4D Viterbi input for each state). The associated branch metric (FIG. 10) is the 4D squared distance between the codeword and the 4D Viterbi input for state 0.

Figure 12:
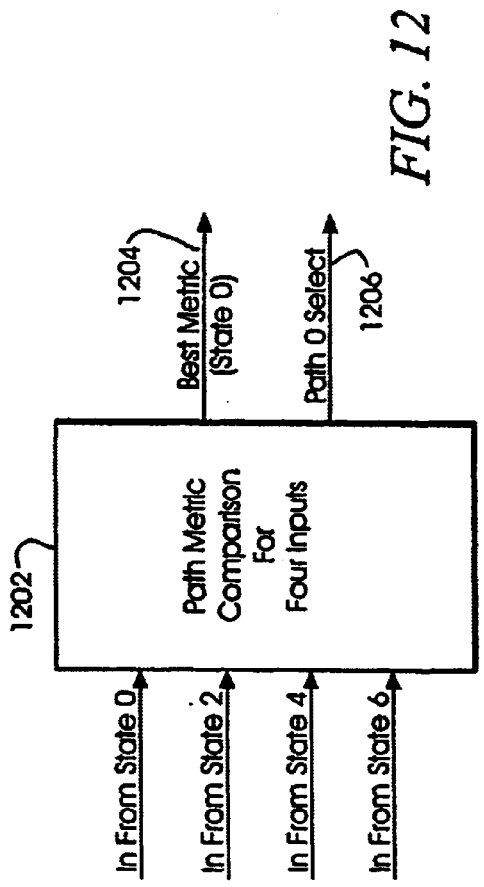
FIG. 12 illustrates the selection of the best path incoming to state 0.

FIG. 12 illustrates the selection of the best path incoming to state 0. The extended path metrics of the four paths incoming to state 0 from states 0, 2, 4 and 6 are inputted to the comparator module 1202 which selects the best path, i.e., the path with the lowest path metric, and outputs the Path 0 Select signal 1206 as an indicator of this path selection, and the associated path metric 1204.

The procedure described above for processing a 4D Viterbi input for state 0 of the code to obtain four branch metrics, four extended path metrics, and four corresponding 4D symbols is similar for the other states. For each of the other states, the selection of the best path from the four incoming paths to that state is also similar to the procedure described in connection with FIG. 12.

The above discussion of the computation of the branch metrics, illustrated by FIGS. 7 through 11, is an exemplary application of the method for slicing (detecting) a received L-dimensional word and for computing the distance of the received L-dimensional word from a codeword, for the particular case where L is equal to 4.

In general terms, i.e., for any value of L greater than 2, the method can be described as follows. The codewords of the trellis code are constellation points chosen from $2^{L-1}$ code-subsets. A codeword is a concatenation of L symbols selected from two disjoint symbol-subsets and is a constellation point belonging to one of the $2^{L-1}$ code-subsets. At the receiver, L inputs are received, each of the L inputs uniquely corresponding to one of the L dimensions. The received word is formed by the L inputs. To detect the received word, $2^{L-1}$ identical input sets are formed by assigning the same L inputs to each of the $2^{L-1}$ input sets. Each of the L inputs of each of the $2^{L-1}$ input sets is sliced with respect to each of the two disjoint symbol-subsets to produce an error set of 2L one-dimensional errors for each of the $2^{L-1}$ code-subsets. For the particular case of the trellis code of the type described by the trellis diagram of FIG. 5, the one-dimensional errors are combined within each of the $2^{L-1}$ error sets to produce $2^{L-2}$ L-dimensional errors for the corresponding code-subset such that each of the $2^{L-2}$ L-dimensional errors is a distance between the received word and one of the codewords in the corresponding code-subset.

One embodiment of this combining operation can be described as follows. First, the 2L one-dimensional errors are combined to produce $2^L$ two-dimensional errors (FIG. 9). Then, the $2^L$ two-dimensional errors are combined to produce $2^L$ intermediate L-dimensional errors which are arranged into $2^{L-1}$ pairs of errors such that these pairs of errors correspond one-to-one to the $2^{L-1}$ code-subsets (FIG. 10, signals 1002 through 1016). A minimum is selected for each of the $2^{L-1}$ pairs of errors (FIG. 10, signals 1026, 1028, 1030, 1032). These minima are the $2^{L-1}$ L-dimensional errors. Due to the constraints on transitions from one state to a successor state, as shown in the trellis diagram of FIG. 5, only half of the $2^{L-1}$ L-dimensional errors correspond to allowed transitions in the trellis diagram. These $2^{L-2}$ L-dimensional errors are associated with $2^{L-2}$ L-dimensional decisions. Each of the $2^{L-2}$ L-dimensional decisions is a codeword closest in distance to the received word (the distance being represented by one of the $2^{L-2}$ L-dimensional errors), the codeword being in one of half of the $2^{L-1}$ code-subsets, i.e., in one of $2^{L-2}$ code-subsets of the $2^{L-1}$ code-subsets (due to the particular constraint of the trellis code described by the trellis diagram of FIG. 5).

It is important to note that the details of the combining operation on the $2^L$ one-dimensional errors to produce the final L-dimensional errors and the number of the final L-dimensional errors are functions of a particular trellis code. In other words, they vary depending on the particular trellis code.

Figure 13:
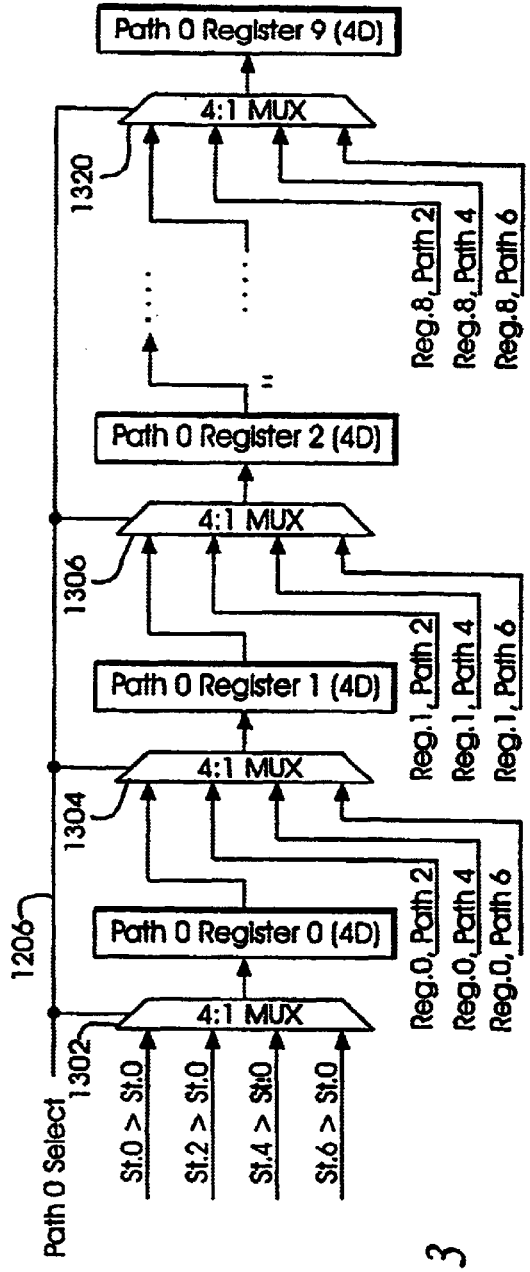
FIG. 13 is a semi-schematic block diagram illustrating the internal arrangement of a portion of the path memory module of FIG. 6.

FIG. 13 illustrates the construction of the path memory module 608 as implemented in the embodiment of FIG. 6. The path memory module 608 includes a path memory for each of the eight paths. In the illustrated embodiment of the invention, the path memory for each path is implemented as a register stack, ten levels in depth. At each level, a 4D symbol is stored in a register. The number of path memory levels is chosen as a tradeoff between receiver latency and detection accuracy. FIG. 13 only shows the path memory for path 0 and continues with the example discussed in FIGS. 7–12. FIG. 13 illustrates how the 4D decision for the path 0 is stored in the path memory module 608, and how the Path 0 Select signal, i.e., the information about which one of the four incoming extended paths to state 0 was selected, is used in the corresponding path memory to force merging of the paths at all depth levels (levels 0 through 9) in the path memory.

Referring to FIG. 13, each of the ten levels of the path memory includes a 4-to-1 multiplexer (4:1 MUX) and a register to store a 4D decision. The registers are numbered according to their depth levels. For example, register 0 is at depth level 0. The Path 0 Select signal 1206 (FIG. 12) is used as the select input for the 4:1 MUXes 1302, 1304, 1306, ..., 1320. The 4D decisions 1130, 1132, 1134, 1136 (FIG. 11) are inputted to the 4:1 MUX 1302 which selects one of the four 4D decisions based on the Path 0 select signal 1206 and stores it in the register 0 of path 0. One symbol period later, the register 0 of path 0 outputs the selected 4D decision to the 4:1 MUX 1304. The other three 4D decisions inputted to the 4:1 MUX 1304 are from the registers 0 of paths 2, 4, and 6. Based on the Path 0 Select signal 1206, the 4:1 MUX 1304 selects one of the four 4D decisions and stores it in the register 1 of path 0. One symbol period later, the register 1 of path 0 outputs the selected 4D decision to the 4:1 MUX 1306. The other three 4D decisions inputted to the 4:1 MUX 1306 are from the registers 1 of paths 2, 4, and 6. Based on the Path 0 Select signal 1206, the 4:1 MUX 1306 selects one of the four 4D decisions and stores it in the register 2 of path 0. This procedure continues for levels 3 through 9 of the path memory for path 0. During continuous operation, ten 4D symbols representing path 0 are stored in registers 0 through 9 of the path memory for path 0.

Similarly to path 0, each of the paths 1 though 7 is stored as ten 4D symbols in the registers of the corresponding path memory. The connections between the MUX of one path and registers of different paths follows the trellis diagram of FIG. 2. For example, the MUX at level k for path 1 receives as inputs the outputs of the registers at level k-1 for paths 1, 3, 5, 7, and the MUX at level k for path 2 receives as inputs the outputs of the registers at level k-1 for paths 0, 2, 4, 6.

Figure 14:
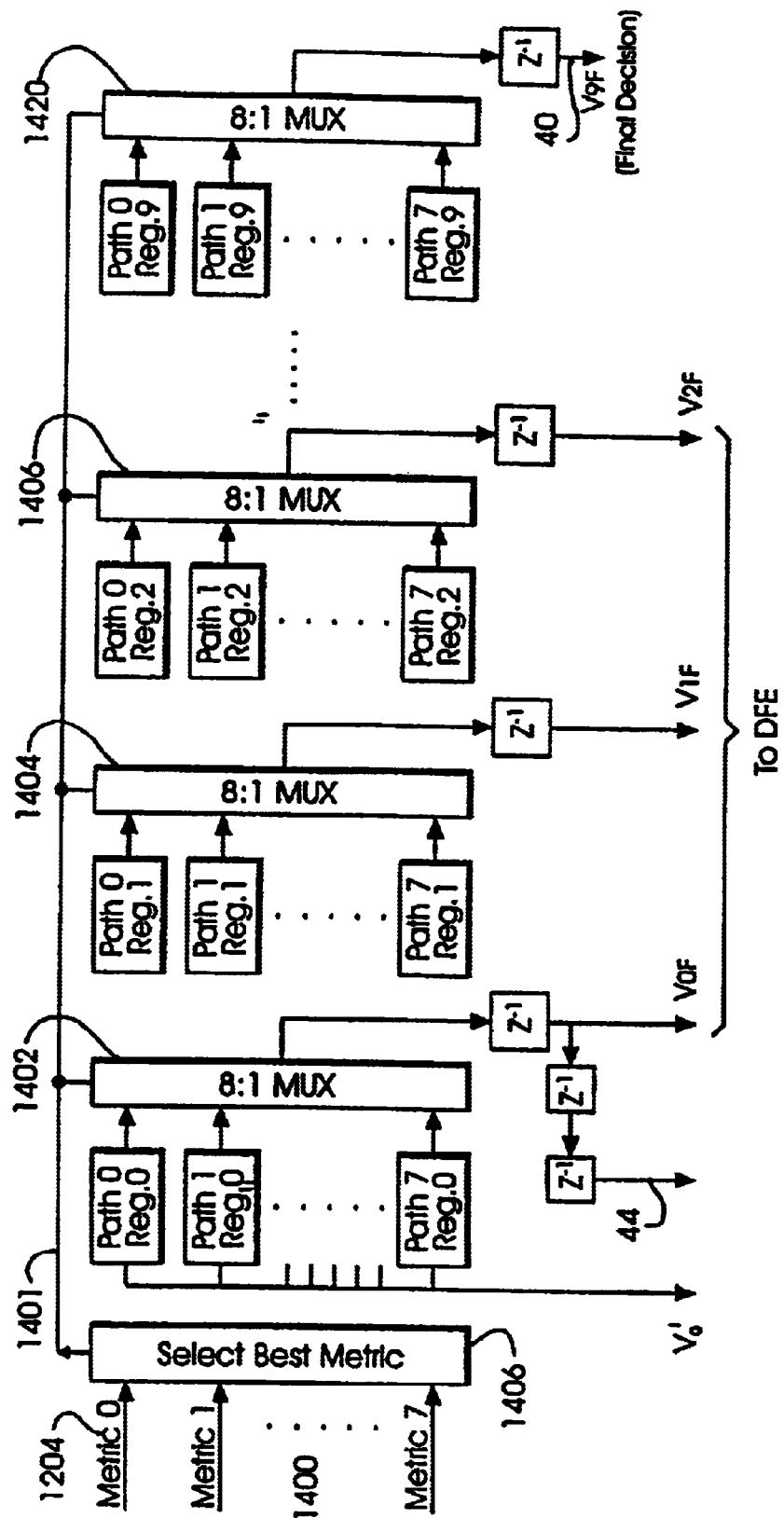
FIG. 14 is a block diagram illustrating the computation of the final decision and the tentative decisions in the path memory module based on the 4D symbols stored in the path memory for each state.

FIG. 14 is a block diagram illustrating the computation of the final decision and the tentative decisions in the path memory module 608 based on the 4D symbols stored in the path memory for each state. At each iteration of the Viterbi algorithm, the best of the eight states, i.e., the one associated with the path having the lowest path metric, is selected, and the 4D symbol from the associated path stored at the last level of the path memory is selected as the final decision 40 (FIG. 6). Symbols at lower depth levels are selected as tentative decisions, which are used to feed the delay line of the DFE 612 (FIG. 6).

Referring to FIG. 14, the path metrics 1402 of the eight states, obtained from the procedure of FIG. 12, are inputted to the comparator module 1406 which selects the one with the lowest value and provides an indicator 1401 of this selection to the select inputs of the 8-to-1 multiplexers (8:1 MUXes) 1402, 1404, 1406, ..., 1420, which are located at path memory depth levels 0 through 9, respectively. Each of the 8:1 MUXes receives eight 4D symbols outputted from corresponding registers for the eight paths, the corresponding registers being located at the same depth level as the MUX, and selects one of the eight 4D symbols to output, based on the select signal 1401. The outputs of the 8:1 MUXes located at depth levels 0 through 9 are $V_0$, $V_1$, $V_2$, ..., $V_9$, respectively.

In the illustrated embodiment, one set of eight signals, output by the first register set (the register 0 set) to the first MUX 1402, is also taken off as a set of eight outputs, denoted $V_0^i$ and provided to the MDFE (602 of FIG. 6) as a select signal which is used in a manner to be described below. Although only the first register set is illustrated as providing outputs to the DFE, the invention contemplates the second, or even higher order, register sets also providing similar outputs. In cases where multiple register sets provide outputs, these are identified by the register set depth order as a subscript, as in $V_1^i$, and the like.

In the illustrated embodiment, the MUX outputs $V_0$, $V_1$, $V_2$ are delayed by one unit of time, and are then provided as the tentative decisions $V_{0F}$, $V_{1F}$, $V_{2F}$ to the DFE 612. The number of the outputs $V_i$ to be used as tentative decisions depends on the required accuracy and speed of decoding operation. After initial delay, the output $V_0$ of the first MUX 1402 is also provided as the 4D tentative decision 44 (FIG. 2) to the Feedforward Equalizers 26 of the four constituent transceivers and the timing recovery block 222 (FIG. 2). The 4D symbol $V_{9F}$, which is the output $V_9$ of the 8:1 MUX 1420 delayed by one time unit, is provided as the final decision 40 to the receive section of the PCS 204R (FIG. 2).

The following is the discussion on how outputs $V_0^i$, $V_1^i$, $V_{0F}$, $V_{1F}$, $V_{2F}$ of the path memory module 608 might be used in the select logic 610, the MDFE 602, and the DFE 612 (FIG. 6).

Figure 15:
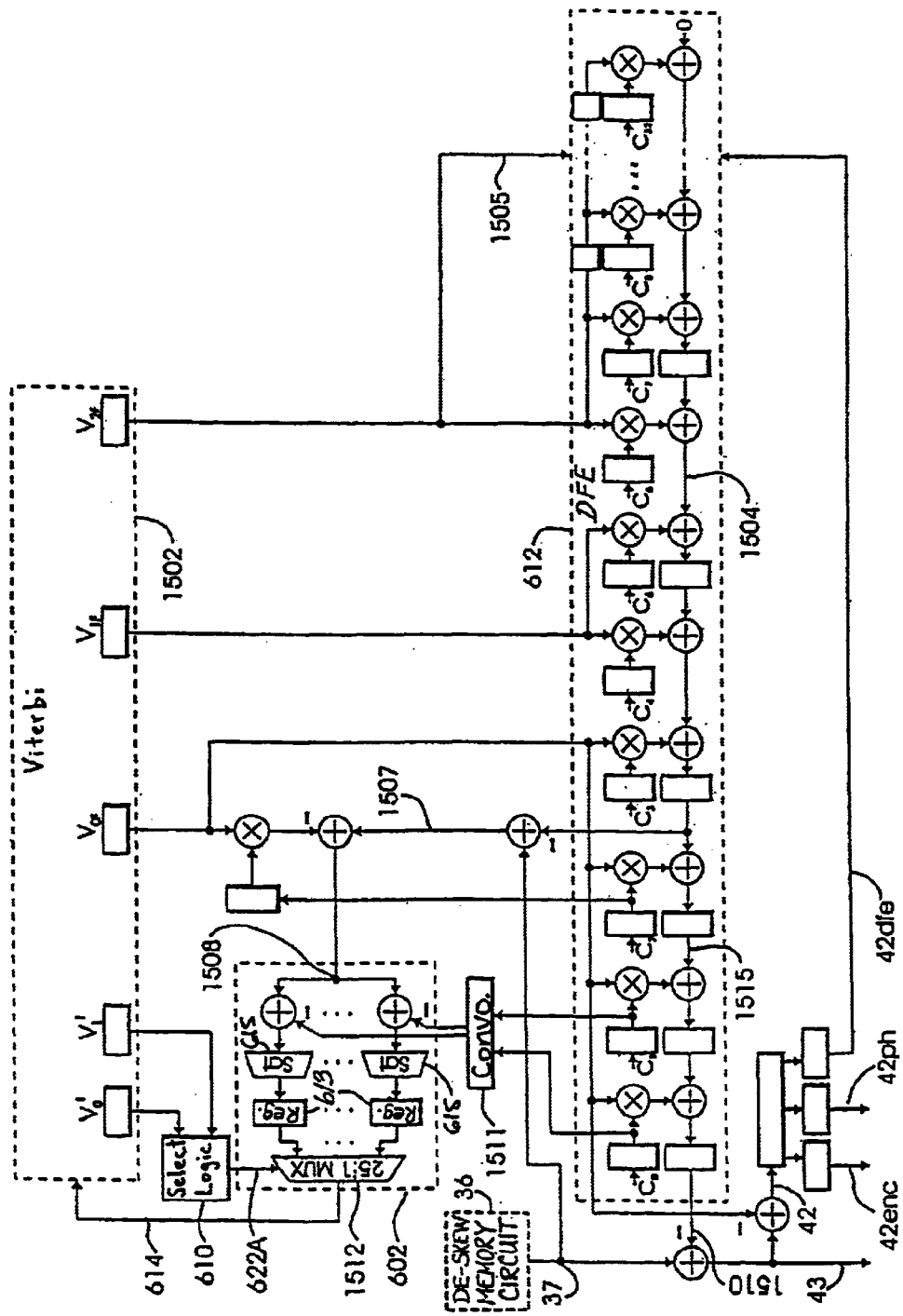
FIG. 15 is a detailed diagram illustrating the processing of the outputs $V_0^{(i)}$, $V_1^{(i)}$, with i=0, ..., 7, and $V_{0F}$, $V_{1F}$, $V_{2F}$ of the path memory module of FIG. 6.
Figure 19:
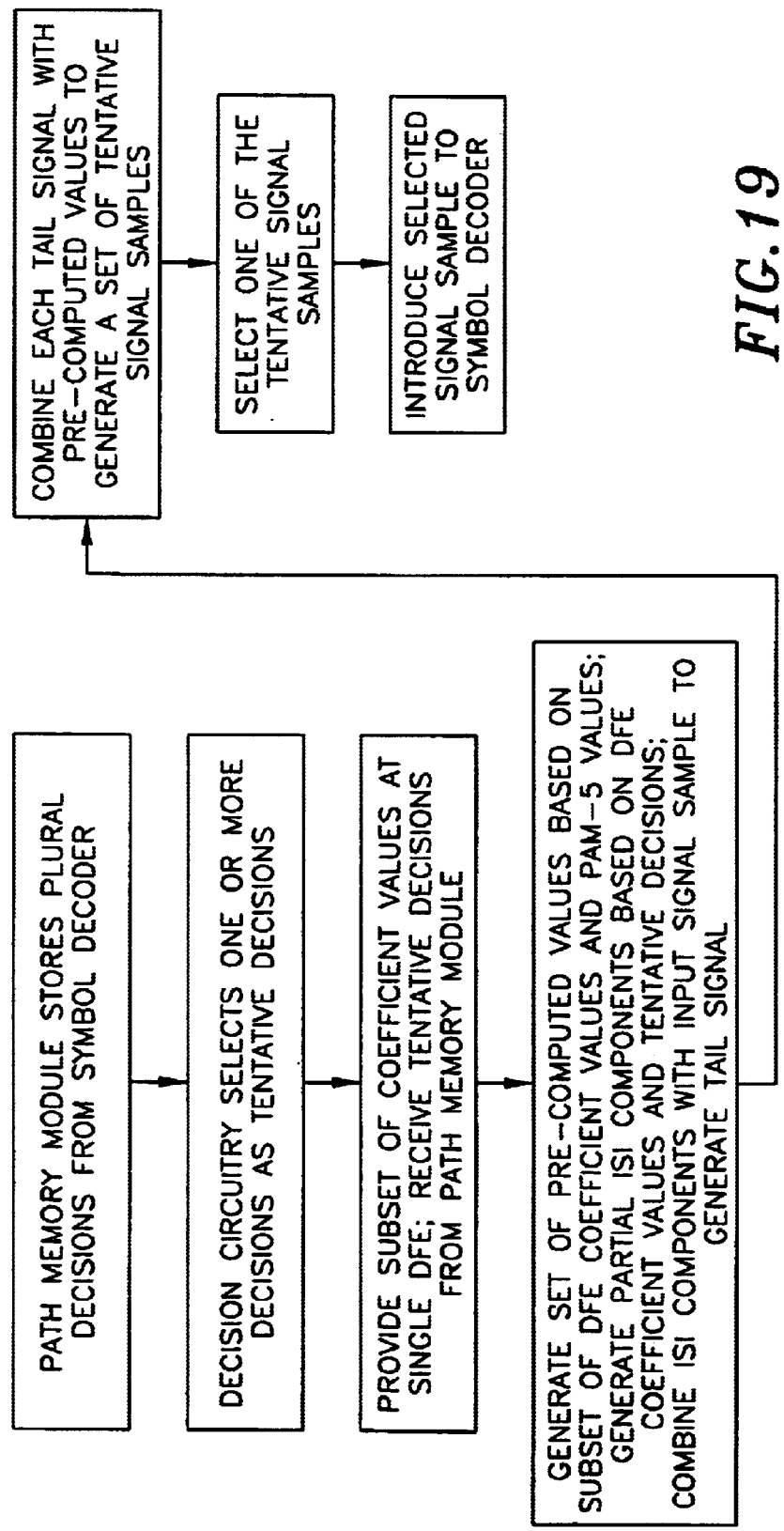
FIG. 19 is a flow chart depicting the operation of the invention in one illustrative embodiment.

FIG. 15 is a block level diagram of the ISI compensation portion of the decoder, including construction and operational details of the DFE and MDFE circuitry (612 and 602 of FIG. 6, respectively). The ISI compensation embodiment depicted in FIG. 15 is adapted to receive signal samples from the deskew memory (36 of FIG. 2) and provide ISI compensated signal samples to the Viterbi (slicer) for decoding. The embodiment illustrated in FIG. 15 includes the Viterbi block 1502 (which includes the Viterbi decoder 604, the path metrics module 606 and the path memory module 608), the select logic 610, the MDFE 602 and the DFE 612.

The MDFE 602 computes an independent feedback signal for each of the paths stored in the path memory module 608. These feedback signals represent different hypotheses for the intersymbol interference component present in the input 37 (FIGS. 2 and 6) to the trellis decoder 38. The different hypotheses for the intersymbol interference component correspond to the different hypotheses about the previous symbols which are represented by the different paths of the Viterbi decoder.

The Viterbi algorithm tests these hypotheses and identifies the most likely one. It is an essential aspect of the Viterbi algorithm to postpone this identifying decision until there is enough information to minimize the probability of error in the decision. In the meantime, all the possibilities are kept open. Ideally, the MDFE block would use the entire path memory to compute the different feedback signals using the entire length of the path memory. In practice, this is not possible because this would lead to unacceptable complexity. By "unacceptable", it is meant requiring a very large number of components and an extremely complex interconnection pattern.

Therefore, in the exemplary embodiment, the part of the feedback signal computation that is performed on a per-path basis is limited to the two most recent symbols stored in register set 0 and register set 1 of all paths in the path memory module 608, namely $V_0^i$ and $V_1^i$ with i=0, ..., 7, indicating the path. For symbols older than two periods, a hard decision is forced, and only one replica of a "tail" component of the intersymbol interference is computed. This results in some marginal loss of performance, but is more than adequately compensated for by a simpler system implementation.

The DFE 612 computes this "tail" component of the intersymbol interference, based on the tentative decisions $V_{0F}$, $V_{1F}$, and $V_{2F}$. The reason for using three different tentative decisions is that the reliability of the decisions increases with the increasing depth into the path memory. For example, $V_{1F}$ is a more reliable version of $V_{0F}$ delayed by one symbol period. In the absence of errors, $V_{1F}$ would be always equal to a delayed version of $V_{0F}$. In the presence of errors, $V_{1F}$ is different from $V_{0F}$, and the probability of $V_{1F}$ being in error is lower than the probability of $V_{0F}$ being in error. Similarly, $V_{2F}$ is a more reliable delayed version of $V_{1F}$.

Referring to FIG. 15, the DFE 612 is a filter having 33 coefficients $c_0$ through $c_{32}$ corresponding to 33 taps and a delay line 1504. The delay line is constructed of sequentially disposed summing junctions and delay elements, such as registers, as is well understood in the art of filter design. In the illustrated embodiment, the coefficients of the DFE 612 are updated once every four symbol periods, i.e., 32 nanoseconds, in well known fashion, using the well known Least Mean Squares algorithm, based on a decision input 1505 from the Viterbi block and an error input 42dfe.

The symbols $V_{0F}$, $V_{1F}$, and $V_{2F}$ are "jammed", meaning inputted at various locations, into the delay line 1504 of the DFE 612. Based on these symbols, the DFE 612 produces an intersymbol interference (ISI) replica portion associated with all previous symbols except the two most recent (since it was derived without using the first two taps of the DFE 612). The ISI replica portion is subtracted from the output 37 of the deskew memory block 36 to produce the signal 1508 which is then fed to the MDFE block. The signal 1508 is denoted as the "tail" component in FIG. 6. In the illustrated embodiment, the DFE 612 has 33 taps, numbered from 0 through 32, and the tail component 1508 is associated with taps 2 through 32. As shown in FIG. 15, due to a circuit layout reason, the tail component 1508 is obtained in two steps. First, the ISI replica associated with taps 3 through 32 is subtracted from the deskew memory output 37 to produce an intermediate signal 1507. Then, the ISI replica associated with the tap 2 is subtracted from the intermediate signal 1507 to produce the tail component 1508.

The DFE 612 also computes the ISI replica 1510 associated with the two most recent symbols, based on tentative decisions $V_{0F}$, $V_{1F}$, and $V_{2F}$. This ISI replica 1510 is subtracted from a delayed version of the output 37 of the deskew memory block 36 to provide a soft decision 43. The tentative decision $V_{0F}$ is subtracted from the soft decision 43 in order to provide an error signal 42. Error signal 42 is further processed into several additional representations, identified as 42enc, 42ph and 42dfe. The error 42enc is provided to the echo cancelers and NEXT cancelers of the constituent transceivers. The error 42ph is provided to the FFEs 26 (FIG. 2) of the four constituent transceivers and the timing recovery block 222. The error 42dfe is directed to the DFE 612, where it is used for the adaptive updating of the coefficients of the DFE together with the last tentative decision $V_{2F}$ from the Viterbi block 1502. The tentative decision 44 shown in FIG. 6 is a delayed version of $V_{0F}$. The soft decision 43 is outputted to a test interface for display purposes.

The DFE 612 provides the tail component 1508 and the values of the two "initial" coefficients $C_0$ and $C_1$ to the MDFE 602. The MDFE 602 computes eight different replicas of the ISI associated with the first two coefficients of the DFE 612. Each of these ISI replicas corresponds to a different path in the path memory module 608. This computation is part of the so-called "critical path" of the trellis decoder 38, in other words, the sequence of computations that must be completed in a single symbol period. At the speed of operation of the Gigabit Ethernet transceivers, the symbol period is 8 nanoseconds. All the challenging computations for 4D slicing, branch metrics, path extensions, selection of best path, and update of path memory must be completed within one symbol period. In addition, before these computations can even begin, the MDFE 602 must have completed the computation of the eight 4D Viterbi inputs 614 (FIG. 6) which involves computing the ISI replicas and subtracting them from the output 37 of the de-skew memory block 36 (FIG. 2). This bottleneck in the computations is very difficult to resolve. The system of the present invention allows the computations to be carried out smoothly in the allocated time.

Referring to FIG. 15, the MDFE 602 provides ISI compensation to received signal samples, provided by the deskew memory (37 of FIG. 2) before providing them, in turn, to the input of the Viterbi block 1502. ISI compensation is performed by subtracting a multiplicity of derived ISI replica components from a received signal sample so as to develop a multiplicity of signals that, together, represents various expressions of ISI compensation that might be associated with any arbitrary symbol. One of the ISI compensated arbitrary symbolic representations is then chosen, based on two tentative decisions made by the Viterbi block, as the input signal sample to the Viterbi.

Since the symbols under consideration belong to a PAM-5 alphabet, they can be expressed in one of only 5 possible values (−2, −1, 0, +1, +2). Representations of these five values are stored in a convolution engine 1511, where they are convolved with the values of the first two filter coefficients $C_0$ and $C_1$ of the DFE 612. Because there are two coefficient values and five level representations, the convolution engine 1511 necessarily gives a twenty five value result that might be expressed as $(a_i C_0 + b_j C_1)$, with $C_0$ and $C_1$ representing the coefficients, and with $a_i$ and $b_j$ representing the level expressions (with i=1,2,3,4,5 and j=1,2,3, 4,5 ranging independently).

These twenty five values are negatively combined with the tail component 1508 received from the DFE 612. The tail component 1508 is a signal sample from which a partial ISI component associated with taps 2 through 32 of the DEE 612 has been subtracted. In effect, the MDFE 602 is operating on a partially ISI compensated (pre-compensated) signal sample. Each of the twenty five pre-computed value is subtracted from the partially compensated signal sample in a respective one of a stack of twenty five summing junctions. Saturators 615 in the MDFE then saturate the twenty five results to make them fit in a predetermined range. This saturation process is done to reduce the number of bits of each of the 1D components of the Viterbi input 614 in order to facilitate lookup table computations of branch metrics. The MDFE 602 then stores the resultant ISI compensated signal samples in a stack of twenty five registers 613, which makes the samples available to a 25:1 MUX for input sample selection. One of the contents of the twenty five registers will correspond to a component of a 4D Viterbi input with the ISI correctly cancelled, provided that there was no decision error (meaning the hard decision regarding the best path forced upon taps 2 though 32 of the DFE 612) in the computation of the tail component. In the absence of noise, this particular value will coincide with one of the ideal 5-level symbol values (i.e., −2, −1, 0, 1, 2). In practice, the will always be noise, so this value will be in general different than any of the ideal symbol values.

This ISI compensation scheme can be expanded to accommodate any number of symbolic levels. If signal processing were performed on PAM-7 signals, for example, the convolution engine 1511 would output forty nine values, i.e., $a_i$ and $b_j$ would range from 1 to 7. Error rate could be reduced, i.e., performance could be improved, at the expense of greater system complexity, by increasing the number of DFE coefficients inputted to the convolution engine 1511. The reason for this improvement is that the forced hard decision (regarding the best path forced upon taps 2 through 32 of the DFE 612) that goes into the "tail" computation is delayed. If $C_2$ were added to the process, and the symbols are again expressed in a PAM-5 alphabet, the convolution engine 1511 would output one hundred twenty five (125) values. Error rate is reduced by decreasing the tail component computation, but at the expense of now requiring 125 summing junctions and registers, and a 125:1 MUX.

It is important to note that, as inputs to the DFE 612, the tentative decisions $V_{0F}$, $V_{1F}$, $V_{2F}$ are time sequences, and not just instantaneous isolated symbols. If there is no error in the tentative decision sequence $V_{0F}$, then the time sequence $V_{2F}$ will be the same as the time sequence $V_{1F}$ delayed by one time unit, and the same as the time sequence $V_{0F}$ delayed by two time units. However, due to occasional decision error in the time sequence $V_{0F}$, which may have been corrected by the more reliable time sequence $V_{1F}$ or $V_{2F}$, time sequences $V_{1F}$ and $V_{2F}$ may not exactly correspond to time-shifted versions of time sequence $V_{0F}$. For this reason, instead of using just one sequence $V_{0F}$, all three sequences $V_{0F}$, $V_{1F}$ and $V_{2F}$ are used as inputs to the DFE 612. Although this implementation is essentially equivalent to convolving $V_{0F}$ with all the DFE's coefficients when there is no decision error in $V_{0F}$, it has the added advantage of reducing the probability of introducing a decision error into the DFE 612. It is noted that other tentative decision sequences along the depth of the path memory 608 may be used instead of the sequences $V_{0F}$, $V_{1F}$ and $V_{2F}$.

Tentative decisions, developed by the Viterbi, are taken from selected locations in the path memory 608 and "jammed" into the DFE 612 at various locations along its computational path. In the illustrated embodiment (FIG. 15), the tentative decision sequence $V_{0F}$ is convolved with the DFE's coefficients $C_0$ through $C_3$, the sequence $V_{1F}$ is convolved with the DFE's coefficients $C_4$ and $C_5$, and the sequence $V_{2F}$ is convolved with the DFE's coefficients $C_6$ through $C_{32}$. It is noted that, since the partial ISI component that is subtracted from the deskew memory output 37 to form the signal 1508 is essentially taken (in two steps as described above) from tap 2 of the DFE 612, this partial ISI component is associated with the DFE's coefficients $C_2$ through $C_{32}$. It is also noted that, in another embodiment, instead of using the two-step computation, this partial ISI component can be directly taken from the DFE 612 at point 1515 and subtracted from signal 37 to form signal 1508.

It is noted that the sequences $V_{0F}$, $V_{1F}$, $V_{2F}$ correspond to a hard decision regarding the choice of the best path among the eight paths (path i is the path ending at state i). Thus, the partial ISI component associated with the DFE's coefficients $C_2$ through $C_{32}$ is the result of forcing a hard decision on the group of higher ordered coefficients of the DFE 612. The underlying reason for computing only one partial ISI signal instead of eight complete ISI signals for the eight states (as done conventionally) is to save in computational complexity and to avoid timing problems. In effect, the combination of the DFE and the MDFE of the present invention can be thought of as performing the functions of a group of eight different conventional DFEs having the same tap coefficients except for the first two tap coefficients.

For each state, there remains to determine which path to use for the remaining two coefficients in a very short interval of time (about 16 nanoseconds). This is done by the use of the convolution engine 1511 and the MDFE 602. It is noted that the convolution engine 1511 can be implemented as an integral part of the MDFE 602. It is also noted that, for each constituent transceiver, i.e., for each 1D component of the Viterbi input 614 (the Viterbi input 614 is practically eight 4D Viterbi inputs), there is only one convolution engine 1511 for all the eight states but there are eight replicas of the select logic 610 and eight replicas of the MUX 1512.

The convolution engine 1511 computes all the possible values for the ISI associated with the coefficients $C_0$ and $C_1$. There are only twenty five possible values, since this ISI is a convolution of these two coefficients with a decision sequence of length 2, and each decision in the sequence can only have five values (−2, −1, 0, +1, +2). Only one of these twenty five values is a correct value for this ISI. These twenty five hypotheses of ISI are then provided to the MDFE 602.

In the MDFE 602, the twenty five possible values of ISI are subtracted from the partial ISI compensated signal 1508 using a set of adders connected in parallel. The resulting signals are then saturated to fit in a predetermined range, using a set of saturators. The saturated results are then stored in a set of twenty five registers. Provided that there was no decision error regarding the best path (among the eight paths) forced upon taps 2 through 32 of the DFE 612, one of the twenty five registers would contain one 1D component of the Viterbi input 614 with the ISI correctly cancelled for one of the eight states.

For each of the eight states, the generation of the Viterbi input is limited to selecting the correct value out of these 25 possible values. This is done, for each of the eight states, using a 25-to-1 multiplexer 1512 whose select input is the output of the select logic 610. The select logic 610 receives $V_0^{(i)}$ and $V_1^{(i)}$ (i=0, . . . , 7) for a particular state i from the path memory module 608 of the Viterbi block 1502. The select logic 610 uses a pre-computed lookup table to determine the value of the select signal 622A based on the values of $V_0^{(i)}$ and $V_1^{(i)}$ for the particular state i. The select signal 622A is one component of the 8-component select signal 622 shown in FIG. 6. Based on the select signal 622A, the 25-to-1 multiplexer 1512 selects one of the contents of the twenty five registers as a 1D component of the Viterbi input 614 for the corresponding state i.

FIG. 15 only shows the select logic and the 25-to-1 multiplexer for one state and for one constituent transceiver. There are identical select logics and 25-to-1 multiplexers for the eight states and for each constituent transceiver. In other words, the computation of the 25 values is done only once for all the eight states, but the 25:1 MUX and the select logic are replicated eight times, one for each state. The input 614 to the Viterbi decoder 604 is, as a practical matter, eight 4D Viterbi inputs.

In the case of the DFE, however, only a single DFE is contemplated for practice of the invention. In contrast to alternative systems where eight DFEs are required, one for each of the eight states imposed by the trellis encoding scheme, a single DFE is sufficient since the decision as to which path among the eight is the probable best was made in the Viterbi block and forced to the DFE as a tentative decision. State status is maintained at the Viterbi decoder input by controlling the MDFE output with the state specific signals developed by the 8 select logics (610 of FIG. 6) in response to the eight state specific signals $V_0^i$ and $V_1^i$, i=0, . . . , 7, from the path memory module (608 of FIG. 6). Although identified as a singular DFE, it will be understood that the 4D architectural requirements of the system means that the DFE is also 4D. Each of the four dimensions (twisted pairs) will exhibit their own independent contributions to ISI and these should be dealt with accordingly. Thus, the DFE is singular, with respect to state architecture, when its 4D nature is taken into account.

In the architecture of the system of the present invention, the Viterbi input computation becomes a very small part of the critical path since the multiplexers have extremely low delay due largely to the placement of the 25 registers between the 25:1 multiplexer and the saturators. If a register is placed at the input to the MDFE 602, then the 25 registers would not be needed. However, this would cause the Viterbi input computation to be a larger part of the critical path due to the delays caused by the adders and saturators. Thus, by using 25 registers at a location proximate to the MDFE output instead of using one register located at the input of the MDFE, the critical path of the MDFE and the Viterbi decoder is broken up into 2 approximately balanced components. This architecture makes it possible to meet the very demanding timing requirements of the Gigabit Ethernet transceiver.

Another advantageous factor in achieving high-speed operation for the trellis decoder 38 is the use of heavily truncated representations for the metrics of the Viterbi decoder. Although this may result in a mathematically non-zero decrease in theoretical performance, the resulting vestigial precision is nevertheless quite sufficient to support healthy error margins. Moreover, the use of heavily truncated representations for the metrics of the Viterbi decoder greatly assists in achieving the requisite high operational speeds in a gigabit environment. In addition, the reduced precision facilitates the use of random logic or simple lookup tables to compute the squared errors, i.e., the distance metrics, consequently reducing the use of valuable silicon real estate for merely ancillary circuitry.

FIG. 16 shows the word lengths used in one embodiment of the Viterbi decoder of this invention. In FIG. 16, the word lengths are denoted by S or U followed by two numbers separated by a period. The first number indicates the total number of bits in the word length. The second number indicates the number of bits after the decimal point. The letter S denotes a signed number, while the letter U denotes an unsigned number. For example, each 1D component of the 4D Viterbi input is a signed 5-bit number having 3 bits after the decimal point.

FIG. 17 shows an exemplary lookup table that can be used to compute the squared 1-dimensional errors. The logic function described by this table can be implemented using read-only-memory devices, random logic circuitry or PLA circuitry. Logic design techniques well known to a person of ordinary skill in the art can be used to implement the logic function described by the table of FIG. 17 in random logic.

FIGS. 18A and 18B provide a more complete table describing the computation of the decisions and squared errors for both the X and Y subsets directly from one component of the 4D Viterbi input to the 1D slicers (FIG. 7). This table completely specifies the operation of the slicers of FIG. 7.

An exemplary demodulator including a high speed decoder has been described and includes various components that facilitate robust and accurate acquisition and decoding of PAM-5 constellation signals at speeds consistent with gigabit operation. Symbol decoding, including ISI compensation, is accurately performed in a symbol period of about 8 ns, by a transceiver demodulator circuit constructed in a manner so as to first, bifurcate the ISI compensation function between an FFE, operating to compensate partial response pulse shaping filter (remote transmitter) induced ISI, and a decoder operating to compensate ISI perturbations induced by transmission channel characteristics, and second, by bifurcating critical path computations into substantially balanced first and second portions, the first portion including computations performed in a DFE and MDFE element and a second portion including computations performed in a Viterbi decoder.

The DFE element is further advantageous in that it is implemented as only a single conceptual DFE (taking into account its 4D nature) rather than an eight element stack, each of which defines a multi-dimensional input to an eight-state Viterbi. The DFE is "stuffed", at particular chosen locations, by the first several stages of a sequential, multi-stage tentative decision path memory module, so as to develop a set of "tail" coefficient values in the DFE which, taken together, represent the algebraic sum of a truncated set of DFE coefficients $C_2$ to $C_{32}$. A received symbol, represented by a five level constellation, is convolved with the remaining two DFE coefficients, $C_0$ and $C_1$, which are taken to represent the transmission channel induced ISI.

As deskewed signals enter the decoder, the previous symbol, convolved with the DFE coefficients $C_3$ to $C_{32}$, is first subtracted therefrom. Then the previous symbol convolved with $C_2$ is subtracted and the resultant (intermediate) symbol is directed to the MDFE. This resultant signal might be described as the receive symbol with partial ISI introduced by previous symbols subtracted. In the MDFE, all possible convolutions of the primary coefficients, $C_0$ and $C_1$, with the possible symbol values, is subtracted from the intermediate symbol to provide a receive symbol without perturbations induced by ISI.

It will be evident to one having skill in the art that although the transceiver has been described in the context of a trellis encoded, PAM-5 signal representation, communicated over a multi-pair transmission channel, the invention is not limited to any particular communication technique. Specifically, the decoder architecture and signal processing methodology in accord with the invention is suitable for use with any form of communication in which the symbolic content of the communication is represented by multi-level signals. The invention, indeed, becomes particularly appropriate as the number of signal levels increases.

Neither is the invention limited to signals encoded in accordance with a 4D, eight-state, trellis methodology. Trellis encoding forces the system to be constructed so as to accommodate the eight states inherent in the trellis methodology. Other coding methodologies and architectures are expressly contemplated by the invention and can be implemented by making the proper modifications to an alternative coding architecture's "state width", as will be apparent to a skilled integrated circuit transceiver designer. Likewise, the "dimensional depth", 1D, 2D, 4D . . . for example, may be suitably increased, or decreased to accommodate different forms of transmission channel implementations. As in the case of increasing signal level representations, the systems and methods of the invention are particularly suitable for channels with increased "depth", such as six, eight, or even higher numbers, of twisted pair cabling, single conductor cabling, parallel wireless channels, and the like.

While certain exemplary embodiments have been described in detail and shown in the accompanying drawings, it is to be understood that such embodiments are merely illustrative of and not restrictive on the broad invention. It will thus be recognized that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and spirit of the invention as defined by the appended claims.

What is claimed is:

1. A method for providing an input signal to a symbol decoder, the input signal being based on a tail value and a subset of coefficient values received from a decision feedback equalizer, the method comprising the operations of:

(a) generating a set of pre-computed values in a multiple decision feedback equalizer, the pre-computed values being based on the subset of coefficient values;

(b) combining each of the pre-computed values with the tail value to generate a plurality of tentative samples; and (c) selecting one of the tentative samples as the input signal to the symbol decoder.

2. The method of claim 1 further comprising the operations of:

(d) storing the tentative samples in a set of registers; and (e) outputting the stored tentative samples to a multiplexer, the multiplexer selecting one of the tentative samples as the input signal to the symbol decoder;

wherein the operation of storing the tentative samples in the registers before providing the tentative samples to the multiplexer facilitates high-speed operation by breaking up a critical path of computations into substantially balanced first and second portions, the first portion including computations in the decision feedback equalizer and the multiple decision feedback equalizer, the second portion including computations in the symbol decoder.

3. The method of claim 1 wherein the decision feedback equalizer comprises a set of ordered coefficients, and the subset of coefficient values comprises values of first two lowest ordered coefficients of the decision feedback equalizer.

4. The method of claim 1 wherein the pre-computed values are based on the subset of coefficient values and values representing levels of a multi-level alphabet.

5. The method of claim 1 wherein in operation (c) said one of the tentative samples is selected based on a symbol received from the symbol decoder.

6. A multiple decision feedback equalizer for providing input signal to a decoder, the multiple decision feedback equalizer receiving a tail value and a subset of coefficient values from a decision feedback equalizer, the multiple decision feedback equalizer comprising:

(a) a computing module for generating a set of pre-computed values based on the subset of coefficient values;

(b) a set of adders coupled to the computing module, the adders corresponding one-to-one to the pre-computed values, each of the adders combining the corresponding pre-computed value with the tail value to generate a plurality of tentative samples; and (c) a multiplexer coupled to the adders, the multiplexer receiving the tentative samples, selecting and outputting one of the tentative samples as the input signal to the decoder.

7. The multiple decision feedback equalizer of claim 6 further comprising:

(d) a set of registers coupled to the set of adders to receive the tentative samples, the registers storing the tentative samples and providing the tentative samples to the multiplexer;

wherein the locations of the registers facilitate high-speed operation by breaking up a critical path of computations into substantially balanced first and second portions, the first portion including computations in the decision feedback equalizer and the multiple decision feedback equalizer, the second portion including computations in the decoder.

* * * * *